(12) United States Patent
Lee et al.

(10) Patent No.: US 9,786,761 B2
(45) Date of Patent: Oct. 10, 2017

(54) INTEGRATED CIRCUIT DEVICE HAVING AN INTERFACIAL LAYER AND METHOD OF MANUFACTURING THE SAME

(71) Applicants: Dong-soo Lee, Gunpo-si (KR); Hu-yong Lee, Seoul (KR); Won-keun Chung, Seoul (KR); Hoon-joo Na, Hwaseong-si (KR); Taek-soo Jeon, Yongin-si (KR); Sang-jin Hyun, Suwon-si (KR)

(72) Inventors: Dong-soo Lee, Gunpo-si (KR); Hu-yong Lee, Seoul (KR); Won-keun Chung, Seoul (KR); Hoon-joo Na, Hwaseong-si (KR); Taek-soo Jeon, Yongin-si (KR); Sang-jin Hyun, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/955,205

(22) Filed: Dec. 1, 2015

(65) Prior Publication Data
US 2016/0315165 A1 Oct. 27, 2016

(30) Foreign Application Priority Data
Apr. 21, 2015 (KR) ........................ 10-2015-0056008

(51) Int. Cl.
*B82Y 10/00* (2011.01)
*H01L 29/51* (2006.01)
(Continued)

(52) U.S. Cl.
CPC ............ *H01L 29/512* (2013.01); *B82Y 10/00* (2013.01); *H01L 27/0924* (2013.01);
(Continued)

(58) Field of Classification Search
CPC ............... H01L 29/785; H01L 27/0924; H01L 21/02532
See application file for complete search history.

(56) References Cited

U.S. PATENT DOCUMENTS 7,002,224 B2 * 2/2006 Li ..................... H01L 21/26506
257/405
7,030,024 B2 4/2006 Ho et al.
(Continued)

FOREIGN PATENT DOCUMENTS

JP 2006-165435 A 6/2006
JP 5579828 B2 8/2014
(Continued)

OTHER PUBLICATIONS

Hwang et al., Al-doped HfO 2 / In 0.53 Ga 0.47 As metal-oxide-semiconductor capacitors, Apr. 4, 2011, Applied Physics Letters, 98, 142901-1.*

(Continued)

*Primary Examiner* — Marcos D Pizarro Crespo
*Assistant Examiner* — Shannon Yi
(74) *Attorney, Agent, or Firm* — Harness, Dickey & Pierce, P.L.C.

(57) ABSTRACT

An integrated circuit device includes a substrate including an active region, an interfacial layer including a lower insulating layer on the active region, the lower insulating layer doped with a chalcogen element having an atomic weight equal to or greater than 16, a gate insulation layer on the interfacial layer, and a gate electrode on the gate insulation layer.

19 Claims, 23 Drawing Sheets

(51) Int. Cl.
*H01L 27/092* (2006.01)
*H01L 29/78* (2006.01)
*H01L 29/423* (2006.01)
*H01L 29/66* (2006.01)
*H01L 29/775* (2006.01)
*H01L 29/06* (2006.01)

(52) U.S. Cl.
CPC ...... *H01L 29/0673* (2013.01); *H01L 29/0676* (2013.01); *H01L 29/42364* (2013.01); *H01L 29/42392* (2013.01); *H01L 29/66439* (2013.01); *H01L 29/775* (2013.01); *H01L 29/785* (2013.01)

(56) References Cited

U.S. PATENT DOCUMENTS

| | | |
|---|---|---|
| 7,179,750 B2 | 2/2007 | Kim et al. |
| 7,271,450 B2 | 9/2007 | Ho et al. |
| 7,323,420 B2 | 1/2008 | Kim et al. |
| 7,563,726 B2 | 7/2009 | Cho et al. |
| 7,892,960 B2 | 2/2011 | Park |
| 7,943,457 B2 | 5/2011 | Chudzik et al. |
| 7,944,004 B2 | 5/2011 | Takayanagi |
| 7,989,280 B2 | 8/2011 | Brask et al. |
| 8,017,469 B2 | 9/2011 | Luo et al. |
| 8,227,307 B2 | 7/2012 | Chen et al. |
| 8,269,281 B2 | 9/2012 | Park |
| 8,283,733 B2* | 10/2012 | Dong ................ H01L 21/28167 257/404 |
| 8,344,418 B2* | 1/2013 | Rachmady ............ H01L 29/513 257/189 |
| 8,436,427 B2 | 5/2013 | Chudzik et al. |
| 8,836,037 B2 | 9/2014 | Ando et al. |
| 2006/0170047 A1 | 8/2006 | Ishimaru |
| 2010/0013022 A1 | 1/2010 | Heung-Jae et al. |
| 2010/0075507 A1 | 3/2010 | Chang et al. |
| 2011/0278676 A1* | 11/2011 | Cheng ............. H01L 21/823807 257/369 |
| 2015/0021558 A1* | 1/2015 | Lee .................... H01L 51/5076 257/40 |
| 2016/0104786 A1* | 4/2016 | Yang .................. H01L 29/4966 257/369 |

FOREIGN PATENT DOCUMENTS

| | | |
|---|---|---|
| JP | 5582582 B2 | 9/2014 |
| KR | 10-0442885 B1 | 8/2004 |
| KR | 10-0611784 B1 | 8/2006 |
| KR | 10-0623584 B1 | 9/2006 |
| KR | 10-0957873 B1 | 5/2010 |

OTHER PUBLICATIONS

RF Cafe, Dielectric Constant, Strength, & Loss Tangent—RF Cafe, Oct. 15, 2008, pp. 1.*

Gupta, Copper Interconnect Technology, 2009, Springer, Chapter 2, pp. 99.*

O'Conner, E. et al. "In situ H2S passivavation of In0.53Ga0.47As/InP metal-oxide-semiconductor capacitors with atomic-layer deposited HfO2 gate dielectric." *Applied Physics Letters* 92 (2008): 022902-1-022902-3.

Brennan, B. et al. "Optimisation of the ammonium sulphide $(NH_4)_2S$ passivation process on $IN_{0.53}Ga_{0.47}As$." Applied Surface Science 257 (2011): 4082-4090.

Allan, Alireza et al. "Oxide Trapping in the InGaAs-$Al_2O_3$ System and the Role of Sulfur in Reducing the $Al_2O_3$ Trap Density." *IEEE Electron Device Letters* 33.11 (2012): 1544-1546.

Oigawa, Haruhiro et al. "Universal Passivation Effect of $(NH_4)_2S_x$ Treatment on the Surface of III-V Compound Semiconductors." *Japanese Journal of Applied Physics* 30.3A (1991): L322-L325.

* cited by examiner

XIB-XIB'

INTEGRATED CIRCUIT DEVICE HAVING AN INTERFACIAL LAYER AND METHOD OF MANUFACTURING THE SAME

CROSS-REFERENCE TO RELATED APPLICATION

This application claims the benefit of Korean Patent Application No. 10-2015-0056008, filed on Apr. 21, 2015, in the Korean Intellectual Property Office, the disclosure of which is incorporated herein in its entirety by reference.

BACKGROUND

Example embodiments of the inventive concepts relate to an integrated circuit device and method of manufacturing the same, and/or more particularly, to an integrated circuit device having an interfacial layer between an active region of a substrate and a gate insulation layer, and method of manufacturing the same.

The performance of a transistor can be improved when using various materials such as a strained channel, a high-k dielectric layer, or a metal gate. However, as the gate length becomes shorter, a high mobility substrate or a high mobility channel material that provides enhanced carrier mobility has been studied as a substitute for silicon.

SUMMARY

According to some example embodiments of the inventive concepts, an integrated circuit device may include a substrate including an active region, an interfacial layer including a lower insulating layer on the active region, the lower insulating layer doped with a chalcogen element having an atomic weight equal to or greater than 16, a gate insulation layer on the interfacial layer, and a gate electrode on the gate insulation layer.

The lower insulating layer may be in contact with the active region.

The substrate may include a III-V group material, a IV group material, or a combination thereof.

The chalcogen element may include sulfur.

The lower insulating layer may include a sulfur-doped aluminum oxide ($Al_2O_3$) layer, a sulfur-doped silicon oxide ($SiO_2$) layer, a sulfur-doped silicon oxynitride (SiON) layer, a sulfur-doped silicon nitride ($Si_3N_4$) layer, or a combination thereof.

The interfacial layer may further include an upper insulating layer between the lower insulating layer and the gate insulation layer and the upper insulating layer may not include a chalcogen element having an atomic weight equal to or greater than 16.

The upper insulating layer may include an aluminum oxide ($Al_2O_3$) layer, a silicon oxide ($SiO_2$) layer, a silicon oxynitride (SiON) layer, an aluminum silicon oxide (AlSiOx, x>0) layer, or a combination thereof.

A content of the chalcogen element in the lower insulating layer may be variable along the thickness direction of the lower insulating layer and may be greater as close to the substrate.

The gate insulation layer may include a material whose a dielectric constant is greater than that of the interfacial layer.

According to some example embodiments of the inventive concepts, an integrated circuit device may include a substrate including a first region and a second region, a first transistor including a first interfacial layer on the substrate of the first region, a first gate insulation layer on the first interfacial layer, and a first gate electrode on the first gate insulation layer, the first interfacial layer may include a lower insulating layer doped with a chalcogen element having an atomic weight equal to or greater than 16, and a second transistor including a second interfacial layer on the substrate of the second region, a second gate insulation layer on the second interfacial layer, and a second gate electrode on the second gate insulation layer, the second interfacial layer may include a material having a composition different from that of a material of the lower insulating layer.

The first interfacial layer may have a double layer structure including a sulfur-doped lower insulating layer and an upper insulating layer containing no sulfur and the second interfacial layer may have a single layer structure including a material identical to that of the upper insulating layer.

The first interfacial layer may have a first thickness and the second interfacial layer may have a second thickness less than the first thickness.

The device may further include a passivation layer between the substrate of the second region and the second interfacial layer and the second interfacial layer may contact the passivation layer.

The first interfacial layer may include a sulfur-doped lower insulating layer and in the passivation layer may include at least one sulfur atomic layer.

The second interfacial layer may contact the sulfur atomic layer.

The first gate insulation layer may include the same material as the second gate insulation layer.

The first region and the second region of the substrate each may include a III-V group material or a IV group material.

The first region and the second region of the substrate each may include InP, $In_zGa_{1-z}As$ ($0 \leq z \leq 1$), $Al_zGa_{1-z}As$ ($0 \leq z \leq 1$), or Ge.

At least one of the first and second regions may include a first conductivity type transistor region and a second conductivity type transistor region having different channel types from each other. The first conductivity type transistor region may include a III-V group material-based active region and the second conductivity type transistor region may include a germanium-based active region.

The device may further include a first fin-shaped active region protruding from the substrate of the first region and a second fin-shaped active region protruding from the substrate of the second region. The first interfacial layer, the first gate insulation layer, and the first gate electrode may cover a top surface and opposite sidewalls of the first fin-shaped active region and may extend in a direction crossing the first fin-shaped active region. The second interfacial layer, the second gate insulation layer, and the second gate electrode may cover a top surface and opposite sidewalls of the second fin-shaped active region and may extend in a direction crossing the second fin-shaped active region.

According to some example embodiments of the inventive concepts, a method of manufacturing an integrated circuit device may include forming an interfacial layer on a substrate, a partial thickness of the total thickness of the interfacial layer doped with a chalcogen element having an atomic weight equal to or greater than 16, forming a gate insulation layer on the interfacial layer, and forming a gate electrode on the gate insulation layer.

The forming of the interfacial layer may include forming a first insulating layer on the substrate, forming a sulfur-doped lower insulating layer by treating the first insulating layer with a sulfur-containing compound, and forming an upper insulating layer on the sulfur-doped lower insulating layer.

Each of the first insulating layer and the upper insulating layer may include an aluminum oxide ($Al_2O_3$) layer, a silicon oxide ($SiO_2$) layer, a silicon oxynitride (SiON) layer, a silicon nitride ($Si_3N_4$) layer, or a combination thereof.

The first insulating layer may include the same material as the upper insulating layer.

The forming of the sulfur-doped lower insulating layer may include removing a native oxide layer from a top surface of the first insulating layer, and treating the first insulating layer with hydrogen sulfide ($H_2S$), disulfur dichloride ($S_2Cl_2$), ammonium sulfide (($NH_4)_2S$), ammonium hydrogen sulfide (($NH_4$)HS), or an organic sulfur compound.

The forming of the sulfur-doped lower insulating layer may be performed through a dry process.

The forming of the sulfur-doped lower insulating layer may be performed through a wet process.

The forming of the gate insulation layer may include forming a second insulating layer on the interfacial layer, the second insulating layer including a material whose dielectric constant is greater than that of the insulating layer.

According to some example embodiments of the inventive concepts, a method of manufacturing an integrated circuit device may include providing a substrate including a first region and a second region, forming an interfacial layer structure including a first interfacial layer on the substrate of the first region, a partial thickness of the total thickness of the first interfacial layer doped with sulfur, and a second interfacial layer covering a sulfur passivation layer on the substrate of the second region, concurrently forming a first gate insulation layer covering the first interfacial layer of the first region and a second gate insulation layer covering the second interfacial layer of the second region, and forming a first gate electrode covering the first gate insulation layer of the first region and a second gate electrode covering the second gate insulation layer of the second region.

The forming of the interfacial layer structure may include forming a first insulating layer on the substrate of the first region, treating the first insulating layer and a top surface of the substrate of the second region with sulfur to form a sulfur-doped lower insulating layer from the first insulating layer of the first region and the sulfur passivation layer on the substrate of the second region, and forming a second insulating layer on the sulfur-doped lower insulating layer and the sulfur passivation layer to provide the first interfacial layer including the sulfur-doped lower insulating layer and an upper insulating layer as a first part of the second insulating layer in the first region and the second interfacial layer as a second part of the second insulating layer in the second region.

The sulfur treatment may be performed through a dry process using gas from a sulfur-containing compound.

The sulfur treatment may be performed through a wet process using gas from a sulfur-containing compound.

The first interfacial layer may include aluminum (Al) and/or silicon (Si) and the second interfacial layer may include the same material as the first interfacial layer.

The first interfacial layer may include a sulfur-doped lower insulating layer having a first thickness and an upper insulating layer containing no sulfur and having a second thickness, and wherein the second interfacial layer may have the second thickness and may include the same material as the upper insulating layer.

BRIEF DESCRIPTION OF THE DRAWINGS

Example embodiments of the inventive concepts will be more clearly understood from the following detailed description taken in conjunction with the accompanying drawings. FIGS. 1 through 15 represent non-limiting, example embodiments as described herein.

FIG. 1 is a cross-sectional view illustrating an essential part of an integrated circuit device according to an example embodiment of the inventive concepts.

FIG. 2 is a graph illustrating sulfur content along a thickness direction of a lower insulating layer of an integrated circuit device according to an example embodiment of the inventive concepts.

FIG. 3 is a block diagram of an integrated circuit device according to an example embodiment of the inventive concepts.

FIG. 4 is a cross-sectional view illustrating essential parts of an integrated circuit device according to an example embodiment of the inventive concepts.

FIG. 6 is a cross-sectional view illustrating essential parts of an integrated circuit device according to an example embodiment of the inventive concepts.

FIG. 7 is a cross-sectional view illustrating essential parts of an integrated circuit device according to an example embodiment of the inventive concepts.

FIG. 9 illustrates a cross-sectional view of an integrated circuit device according to an example embodiment of the inventive concepts.

FIG. 10 is a perspective view of an integrated circuit device according to an example embodiment of the inventive concepts.

FIG. 12 is a perspective view of an integrated circuit device according to an example embodiment of the inventive concepts.

FIG. 13 is a schematic block diagram of a display device including a display driver IC (DDI) according to an example embodiment of the inventive concepts.

FIG. 14 is a block diagram illustrating an electronic system according to an example embodiment of the inventive concepts.

FIG. 15 is a block diagram illustrating an electronic system according to an example embodiment of the inventive concepts.

DETAILED DESCRIPTION

Figure 1:
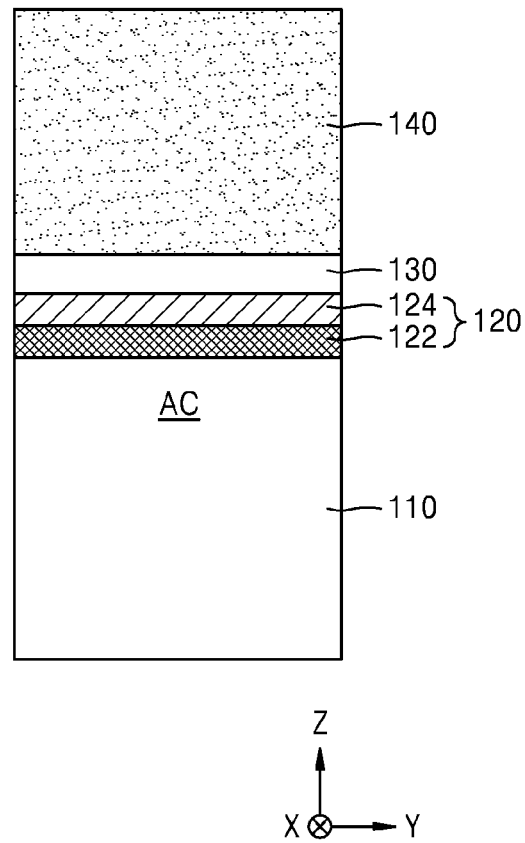

Hereinafter, example embodiments of the inventive concepts will be described with reference to the accompanying drawings. The inventive concepts may, however, be embodied in many different forms and should not be construed as being limited to the embodiments set forth herein; rather, these example embodiments are provided so that this disclosure will be thorough and complete, and will fully convey the inventive concepts to those of ordinary skill in the art. It should be understood, however, that there is no intent to limit the inventive concepts to the particular forms disclosed, but on the contrary, the inventive concepts are to cover all modifications, equivalents, and alternatives falling within the spirit and scope of the inventive concepts. Like reference numerals denote like elements throughout the specification and drawings. In the drawings, the dimensions of structures are exaggerated or reduced for clarity of the inventive concepts.

Also, though terms "first" and "second" are used to describe various members, components, regions, layers, and/or portions in various embodiments of the inventive concepts, the members, components, regions, layers, and/or portions are not limited to these terms. These terms are used only to differentiate one member, component, region, layer, or portion from another one. Therefore, a member, a component, a region, a layer, or a portion referred to as a first member, a first component, a first region, a first layer, or a first portion in an embodiment may be referred to as a second member, a second component, a second region, a second layer, or a second portion in another embodiment.

Unless otherwise defined, all terms used herein, including technical and scientific terms, have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list.

As in the following, a method of manufacturing an integrated circuit device according to an example embodiment of the inventive concepts will be described in detail with reference to FIGS. 1 through 15.

FIG. 1 is a cross-sectional view illustrating an essential part of an integrated circuit device 100 according to an example embodiment of the inventive concepts.

Referring to FIG. 1, the integrated circuit device 100 includes a semiconductor substrate 110 having an active region AC, an interfacial layer 120 formed on the active region AC, a gate insulation layer 130 formed on the interfacial layer 120, and a gate electrode 140 formed on the gate insulation layer 130.

In an example embodiment, the semiconductor substrate 110 may include a III-V group material, a IV group material, or a combination thereof. The III-V group material may be a binary compound, a ternary compound, or a quaternary compound, each of which contains at least one ill group element and at least one V group element. The III-V group material may be a compound including at least one element of indium (In), gallium (Ga), and aluminum (Al) as a III group element and at least one element of arsenic (As), phosphorus (P), and antimonium (Sb) as a V group element. For example, the III-V group material may include InP, $In_ZGa_{1-Z}As$ (0≤z≤1), or $Al_ZGa_{1-Z}As$ (0≤z≤1). The binary compound may include, for example, InP, GaAs, InAs, InSb, GaSb, or a combination thereof. The ternary compound may include InGaP, InGaAs, AlInAs, InGaSb, GaAsSb, GaAsP, or a combination thereof. The IV group material may include silicon (Si) or germanium (Ge). But, the III-V group material and the IV group material available to an integrated circuit device according to example embodiments of the inventive concepts are not limited thereto.

The III-V group material and the IV group material (e.g., Ge) may be used as a channel material for a low-power and high-speed transistor. Using a semiconductor substrate comprising a III-V group material (e.g., GaAs) having an electron mobility greater than that of a silicon (Si) substrate and a semiconductor substrate comprising a semiconductor material (e.g., Ge) having a hole mobility greater than that of the silicon (Si) substrate, a high-performance CMOS device may be formed. In an example embodiment, when an N-type channel is formed on the active region AC, the semiconductor substrate 110 may include one of the III-V group material described above. In another example embodiment, when a P-type channel is formed on the active region AC, the semiconductor substrate 110 may include Ge.

The interfacial layer 120 may include a lower insulating layer 122 doped with a chalcogen element having an atomic weight equal to or greater than 16 (e.g., ranging from 16 to 52) and an upper insulating layer 124 covering the lower insulating layer 122. The upper insulating layer 124 may be disposed between the lower insulating layer 122 and the gate insulation layer 130. The lower insulating layer 122 and the upper insulating layer 124 each may include a material having a dielectric constant equal to or less than 10 (e.g., ranging from 1 to 10).

The chalcogen element doped in the lower insulating layer 122 may include sulfur, selenium, tellurium, or a combination thereof. In an example embodiment, the lower insulating layer 122 may include a sulfur-doped aluminum oxide ($Al_2O_3$) layer, a sulfur-doped silicon oxide ($SiO_2$) layer, a sulfur-doped silicon oxynitride (SiON) layer, a sulfur-doped silicon nitride ($Si_3N_4$) layer, or a combination thereof.

The lower insulating layer 122 may contact the active region AC of the semiconductor substrate 110. In this case, the chalcogen element (e.g., sulfur) having an atomic weight equal to or greater than 16 (e.g., ranging from 16 to 52) doped in the lower insulating layer 122 may cure an interface defect from a surface of the active region AC between the semiconductor substrate 110 and the lower insulating layer 122.

Figure 2:
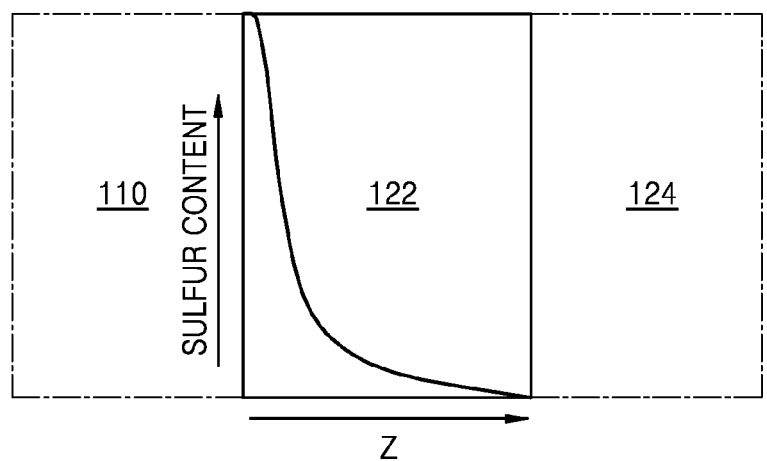

FIG. 2 is a graph illustrating sulfur content in a thickness direction (Z direction) of the lower insulating layer 122 in the case where a chalcogen element doped in the lower insulating layer 122 is sulfur. In FIG. 2, for the convenience of understanding, the semiconductor substrate 110 disposed under the lower insulating layer 122 and the upper insulating layer 124 disposed over the lower insulating layer 122 are shown together.

As depicted in FIG. 2, the sulfur content doped in the lower insulating layer 122 may vary in the thickness direction of the lower insulating layer 122 and may be greater as close to the substrate 110.

The sulfur atoms doped in the lower insulating layer 122 may be intensively distributed at the interface between the semiconductor substrate 110 and the lower insulating layer 122. Accordingly, the sulfur atoms concentrated at the interface between the semiconductor substrate 110 and the lower insulating layer 122 may reduce an interface defect density in the vicinity of a surface of the semiconductor substrate 110.

The upper insulating layer 124 may not include a chalcogen element having an atomic weight equal to or greater than 16. In an example embodiment, the upper insulating layer 124 may include an aluminum oxide ($Al_2O_3$) layer, a silicon oxide ($SiO_2$) layer, a silicon oxynitride (SiON) layer, an aluminum silicon oxide (AlSiOx, x>0) layer, or a combination thereof.

The lower insulating layer 122 and the upper insulating layer 124 may include at least one same element. For example, the lower insulating layer 122 may include a sulfur-doped aluminum oxide ($Al_2O_3$) layer and the upper insulating layer 124 may include a sulfur-undoped aluminum oxide ($Al_2O_3$) layer. The lower insulating layer 122 and the upper insulating layer 124 each may have a thickness ranging from 5 Å to 20 Å, but it is not limited thereto.

The gate insulation layer 130 may include a material whose dielectric constant is greater than those of the lower insulating layer 122 and the upper insulating layer 124. For example, the gate insulation layer 130 may include a material whose dielectric constant ranges from 10 to 25.

In an example embodiment, the gate insulation layer 130 may include hafnium oxide, hafnium oxynitride, hafnium silicon oxide, lanthanum oxide, lanthanum aluminium oxide, zirconium oxide, zirconium silicon oxide, tantalum oxide, tantalum silicon oxide, titanium oxide, barium strontium titanium oxide, barium titanium oxide, strontium titanium oxide, yttrium oxide, erbium oxide, dysprosium oxide, gadolinium oxide, aluminium oxide, lead scandium tantalum oxide, lead zinc niobate, or a combination thereof. For example, the gate insulation layer 130 may include hafnium oxide ($HfO_2$), zirconium oxide ($ZrO_2$), hafnium silicon oxide (HfSiOx), tantalum silicon oxide (TaSiOx), or lanthanum oxide (LaOx), but it is not limited thereto.

The gate electrode 140 may include a metal-containing layer for adjusting a work function and a gap-filling metal-containing layer on the metal-containing layer for adjusting a work function. In an example embodiment, the gate electrode 140 may include a structure in which a metal nitride layer, a metal layer, a conductive capping layer, and a gap-filling metal layer are sequentially stacked. The metal nitride layer and the metal layer each may include titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), lead (Pb), or a combination thereof. The conductive capping layer may act as a protective layer for preventing a surface of the metal layer from oxidizing. Furthermore, the conductive capping layer may act as a wetting layer for depositing another conductive layer on the metal layer. The conductive capping layer may include a metal nitride, for example, TiN, TaN, or a combination thereof, but it is not limited thereto. The gap-filling metal layer may include a tungsten layer. The gap-filling metal layer may completely fill a recess region delimited by a step portion of the conductive capping layer without a void.

The integrated circuit device 100 as depicted in FIG. 1 may include the interfacial layer 120 disposed between the semiconductor substrate 110 and the gate insulation layer 130. The interfacial layer 120 may include the lower insulating layer 122 (i.e., a portion of the interfacial layer 120 adjacent to the semiconductor substrate 110) doped with a chalcogen element having an atomic weight equal to or greater than 16 (e.g., ranging from 16 to 52). Accordingly, the chalcogen elements (e.g., sulfur atoms) doped in the lower insulating layer 122 may cure an interface defect from the surface of the active region AC and may reduce the interface defect density in the vicinity of the surface of the active region AC. The integrated circuit device 100 may be advantageously applied to implement a device requiring high voltage operation and high reliability.

Figure 3:
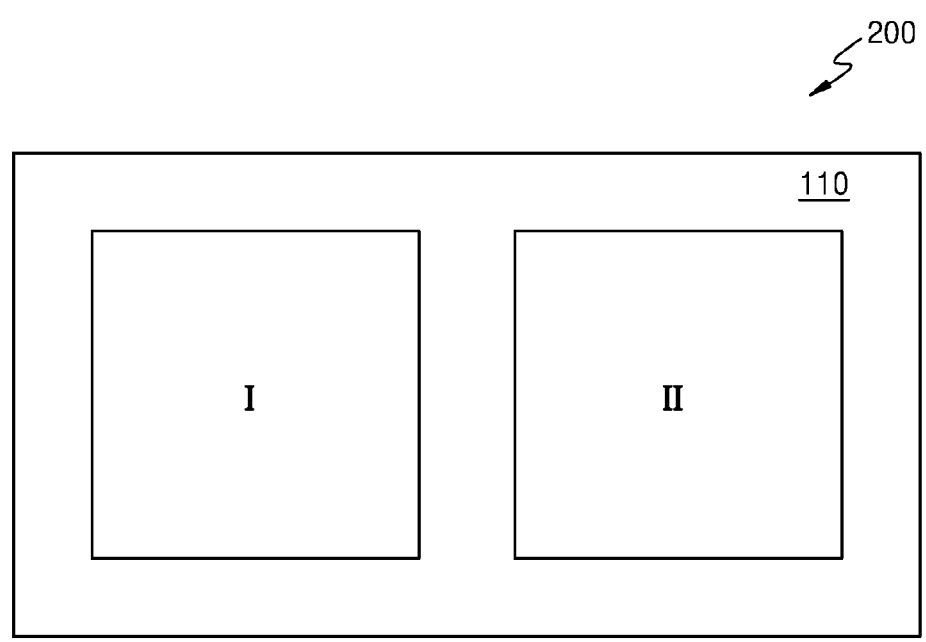

FIG. 3 is a block diagram of an integrated circuit device 200 according to an example embodiment of the inventive concepts. In FIG. 3, the same reference numerals as those illustrated in FIG. 1 denote the same elements and a discussion thereof will not be given.

Referring to FIG. 3, the integrated circuit device 200 may include a first region I and a second region II. The first region I and the second region II may perform different functions each other on the same substrate 110. The first region I and the second region II may be spaced apart from each other, or may be connected to each other.

In an example embodiment, the first region I may be a high voltage region for forming a high voltage transistor to which a relatively high operating voltage is applied and the second region II may be a low voltage region for forming a low voltage transistor to which a relatively low operating voltage is applied. For example, the high voltage transistor may have an operating voltage equal to or greater than 1 volt, and the low voltage transistor may have an operating voltage less than 1 volt.

The first region I may be a region for forming a transistor having a high reliability, even though a threshold voltage thereof is relatively high and a switching speed thereof is not faster. In an example embodiment, the first region I may be a peripheral circuit region including peripheral circuits inputting external data to the internal circuitry of the integrated circuit device 200 or outputting data from the internal circuitry of the integrated circuit device 200 to the outside thereof.

The second region II may be a region for forming a transistor having a relatively low threshold voltage and a high switching speed. In an example embodiment, the second region II may be a cell array region in which multiple unit memory cells are arranged in a matrix form. For example, the second region II may be a logic cell region or a memory cell region. The logic region may include various types of logic cells as standard cells performing a desired logic function such as a counter, or a buffer. The logic cells may include a plurality of circuit elements such as a transistor, or a resistor. The logic cell may include AND, NAND, OR, NOR, XOR (exclusive OR), XNOR (exclusive NOR), INV (inverter), ADD (adder), BUF (buffer), DLY (delay), FILL (filter), multiplexer (MXT/MXIT), OAI (OR/AND/INVERTER), AO (AND/OR), AOI (AND/OR/INVERTER), delay flip-flop, reset flip-flop, master-slaver flip-flop, or latch, but it is not limited thereto. The memory cell region may include a SRAM cell region, a DRAM cell region, a MRAM cell region, a RRAM cell region, a PRAM cell region or a combination thereof.

Figure 4:
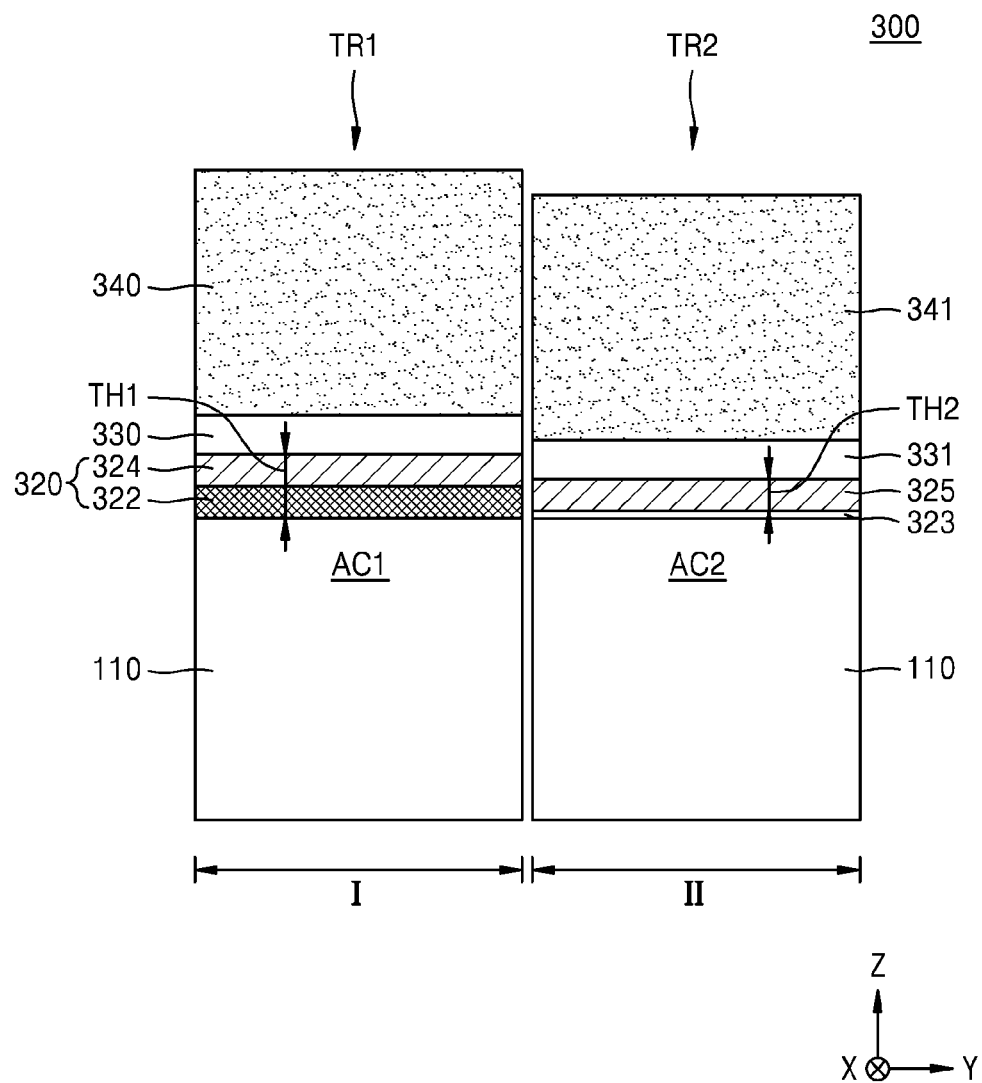

FIG. 4 is a cross-sectional view illustrating essential parts of an integrated circuit device 300 according to an example embodiment of the inventive concepts. In FIG. 4, the same reference numerals as those illustrated in FIGS. 1 through 3 denote the same elements and a discussion thereof will not be given.

Referring to FIG. 4, the integrated circuit device 300 may include the semiconductor substrate 110 having a first region I and a second region II, a first transistor TR1 formed in the first region I, and a second transistor TR2 formed in the second region II.

The first transistor TR1 in the first region I may include a first interfacial layer 320, a first gate insulation layer 330, and a first gate electrode 340 sequentially stacked on a first active region AC1 of the semiconductor substrate 110.

The first interfacial layer 320 of the first transistor TR1 may have a double layer structure including a lower insulating layer 322 formed on the first active region AC1 and doped with a chalcogen element having an atomic weight equal to or greater than 16 (e.g., ranging from 16 to 52) and an upper insulating layer 324 covering the lower insulating layer 322. Specific details of the first interfacial layer 320 including the lower insulating layer 322 and the upper insulating layer 324 are substantially the same as those of the interfacial layer 120 including the lower insulating layer 122 and the upper insulating layer 124 described with reference to FIG. 1.

The first gate insulation layer 330 and the first gate electrode 340 may have substantially the same structure as the gate insulation layer 130 and the gate electrode 140 described with reference to FIG. 1.

The second transistor TR2 in the second region II may include a passivation layer 323, a second interfacial layer 325, a second gate insulation layer 331, and a second gate electrode 341 sequentially stacked on a second active region AC2 of the semiconductor substrate 110.

The passivation layer 323 may be formed to contact a top surface of the second active region AC2. The passivation layer 323 may include a chalcogen element having an atomic weight equal to or greater than 16 (e.g., ranging from 16 to 52). When the chalcogen element (e.g., sulfur atoms) constituting the passivation layer 323 bonds to a surface of the second active region AC2, an element constituting the second active region AC2 (e.g., a III group element, a IV group element or a V group element) may be substituted with the chalcogen element having an atomic weight equal to or greater than 16 (e.g., ranging from 16 to 52), or a dangling bond of a III group element, a IV group element or a V group element may be cured by the chalcogen element having an atomic weight equal to or greater than 16 (e.g., ranging from 16 to 52). For example, when the second active region AC2 of the semiconductor substrate 110 is formed of GaAs, the chalcogen element constituting the passivation layer 323 (e.g., sulfur atom) forms a Ga—S bond, thereby removing a Ga dangling bond. In addition, when the passivation layer 323 bonds to the surface of the second active region AC2, a defect such as a vacancy or an unsaturated bond may be cured by an increased bond energy.

In an example embodiment, the passivation layer 323 may include sulfur (S), selenium (Se), tellurium (Te), or a combination thereof. For example, the passivation layer 323 may include a sulfur passivation layer. The sulfur passivation layer may include one sulfur atomic layer, two sulfur atomic layers, or three sulfur atomic layers. In an example embodiment, the passivation layer 323 may have a thickness ranging from 2 Å to 10 Å, but it is not limited thereto.

For example, in the case where the semiconductor substrate 110 includes a III-V group substrate, the III-V group substrate is easily oxidized as compared to a silicon (Si) substrate. Furthermore, when a surface of the III-V group substrate is oxidized, a surface roughness of the III-V group substrate may increase and physical and/or electrical defects may be generated. However, when the passivation layer 323 is formed between the III-V group substrate having these defects and the second interfacial layer 325, oxidation at an interface between the III-V group substrate and the second interfacial layer 325 may be suppressed and electrical characteristics of the integrated circuit device 300 may be improved.

Figure 5A:
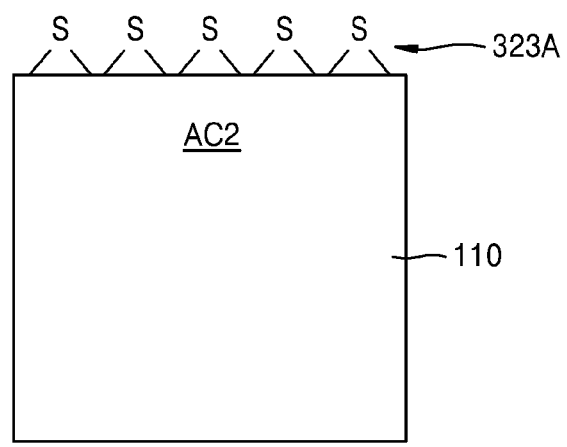
FIG. 5A is a cross-sectional view illustrating a sulfur passivation layer constituted by a single-sulfur atomic layer, as an example of a passivation layer of an integrated circuit device according to an example embodiment of the inventive concepts.

FIG. 5A illustrates a sulfur passivation layer 323A constituted by one sulfur atomic layer, as an example embodiment of the passivation layer 323 described with reference to FIG. 4.

In an example embodiment, the sulfur atoms constituting the sulfur passivation layer 323A may be present in a chemical bonding state between the semiconductor atoms constituting the semiconductor substrate 110 (e.g., III group atoms and/or V group atoms).

Figure 5B:
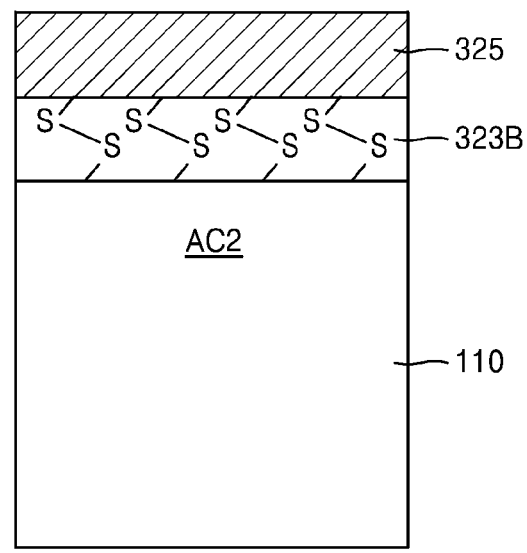
FIG. 5B is a cross-sectional view illustrating a sulfur passivation layer constituted by a double-sulfur atomic layer, as another example of a passivation layer of an integrated circuit device according to an example embodiment of the inventive concepts.

FIG. 5B illustrates a sulfur passivation layer 323B consisting of two sulfur atomic layers, as another example embodiment of the passivation layer 323 described with reference to FIG. 4.

The sulfur passivation layer 323B may include a S—S bond between the second active region AC2 of the semiconductor substrate 110 and the second interfacial layer 325.

Referring again to FIG. 4, in the second transistor TR2 in the second region II, the second interfacial layer 325 contacts the passivation layer 323. In an example embodiment, in the case where the passivation layer 323 includes at least one sulfur atomic layer, the second interfacial layer 325 may be formed to be directly in contact with the sulfur atomic layer of the passivation layer 323.

The second interfacial layer 325 may include a material having a dielectric constant equal to or less than 10 (e.g., ranging from 1 to 10). In an example embodiment, the second interfacial layer 325 may be formed of a material having a composition different from that of a material of the lower insulating layer 322 as a part of the first interfacial layer 320 in the first region I. In an example embodiment, the second interfacial layer 325 may be formed of the same composition material as the upper insulating layer 324 constituting the first interfacial layer 320 of the first transistor TR1 in the first region I. The second interfacial layer 325 may not include a chalcogen element having an atomic weight equal to or greater than 16 (e.g., ranging from 16 to 51). In an example embodiment, the second interfacial layer 325 may include an aluminum oxide ($Al_2O_3$) layer, a silicon oxide ($SiO_2$) layer, a silicon oxynitride (SiON) layer, an aluminum silicon oxide (AlSiOx, x>0) layer, or a combination thereof.

In an example embodiment, the lower insulating layer 322 and the upper insulating layer 324 of the first interfacial layer 320 and the second interfacial layer 325 each may include a same metal. For example, the lower insulating layer 322 of the first interfacial layer 320 may be formed of a sulfur-doped $Al_2O_3$ layer, and each of the upper insulating layer 324 of the first interfacial layer 320 and the second interfacial layer 325 may be formed of an $Al_2O_3$ layer. The upper insulating of layer 324 of the first interfacial layer 320 may have the same thickness as the second interfacial layer 325, and the second interfacial layer 325 may have a second thickness TH2 less than a first thickness TH1 of the first interfacial layer 320.

The second gate insulation layer 331 may have a dielectric constant greater than that of the second interfacial layer 325. For example, the second gate insulation layer 331 may be formed of a material having a dielectric constant ranging from 10 to 25. The second gate insulation layer 331 may have substantially the same structure as the gate insulation layer 130 described with reference to FIG. 1. In an example embodiment, the second gate insulation layer 331 may have the same material as the first gate insulation layer 330 in the first region I. In an example embodiment, the second gate insulation layer 331 may have substantially the same thickness as the first gate insulation layer 330 in the first region I.

The second gate electrode 341 may include a metal-containing layer for adjusting a work function and a gap-filling metal-containing layer on the metal-containing layer for adjusting a work function. In an example embodiment, the second gate electrode 341 may include a structure in which a metal nitride layer, a metal layer, a conductive capping layer, and a gap-filling metal layer are sequentially stacked. The second gate electrode 341 may have substantially the same structure as the gate electrode 140 described with reference to FIG. 1.

Figure 6:
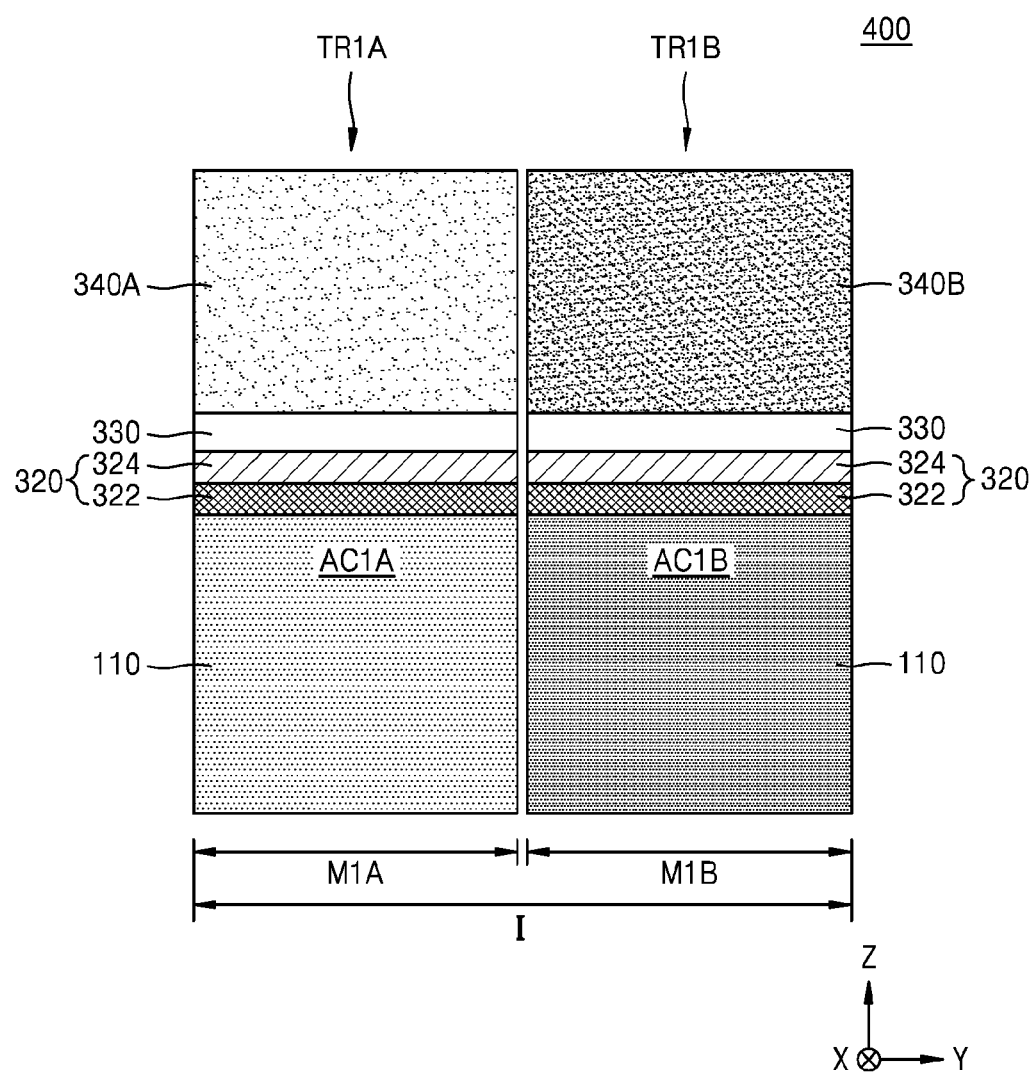

FIG. 6 is a cross-sectional view illustrating essential parts of an integrated circuit device 400 according to an example embodiment of the inventive concepts. In FIG. 6, the same reference numerals as those illustrated in FIGS. 1 through 5 denote the same elements and a discussion thereof will not be given.

Referring to FIG. 6, a first region I of the integrated circuit device 400 may include a first MOS region M1A for forming a first conductivity channel type transistor TR1A and a second MOS region M1B for forming a second conductivity channel type transistor TR1B. The first region I illustrated in FIG. 4 may be any one of the first MOS region M1A and the second MOS region M1B illustrated in FIG. 6. The first conductivity type and the second conductivity type may be different from each other. For example, when the first conductivity type is N-type, the second conductivity type is P-type. Conversely, when the first conductivity type is P-type, the second conductivity type is N-type.

In an example embodiment, the first conductivity channel type transistor TR1A may be an N channel type transistor, and the second conductivity channel type transistor TR1B may be a P channel type transistor. In this case, the substrate 110 of the first MOS region M1A may include an active region AC1A formed of a III-V group material, and the substrate 110 of the second MOS region M1B may include an active region AC1B formed of a IV group material. For example, the active region AC1A of the first MOS region M1A may include InP, $In_zGa_{1-z}As$ ($0 \le z \le 1$), or $Al_zGa_{1-z}As$ ($0 \le z \le 1$). The active region AC1B of the second MOS region M1B may include Ge.

In an example embodiment, a gate electrode 340A of the first conductivity channel type transistor TR1A in the first MOS region M1A may have a structure in which a metal nitride-containing layer, an aluminium-doped metal-containing layer for determining a work function, a conductive capping layer, and a gap-filling metal layer are sequentially stacked. The aluminium-doped metal-containing layer may provide a work function ranging from 4.1 eV to 4.5 eV, but it is not limited thereto.

In an example embodiment, the metal nitride-containing layer may be formed of a nitride of a metal. The metal may include titanium (Ti), tantalum (Ta), tungsten (W), ruthenium (Ru), niobium (Nb), molybdenum (Mo), hafnium (Hf), or a combination thereof. The aluminium-doped metal-containing layer may include TaAlC or TiAlC. The conductive capping layer may include TiN, TaN, or a combination thereof. The conductive capping layer in the first MOS region M1A may be omitted. The gap-filling metal layer may include tungsten (W), but it is not limited thereto.

In an example embodiment, a gate electrode 340B of the second conductivity channel type transistor TR1B in the second MOS region M1B may have a structure in which a first metal nitride-containing layer, a second metal nitride-containing layer, an aluminium-doped metal-containing layer, a conductive capping layer, and a gap-filling metal layer are sequentially stacked. The first metal nitride-containing layer and the second metal nitride-containing layer each may be formed of a nitride of a metal including Ti, Ta, W, Ru, Nb, Mo, Hf, or a combination thereof. Each of the first metal nitride-containing layer and the second nitride-containing layer may include titanium nitride having a nitrogen content greater than a titanium content. A work function of the second conductivity channel type transistor TR1B may be determined by the first metal nitride-containing layer and the second metal nitride-containing layer. For example, the first metal nitride-containing layer and the second metal nitride-containing layer may provide a work function ranging from 4.8 eV to 5.2 eV. The aluminium-doped metal-containing layer in the second MOS region M1B may have substantially the same composition and the same thickness as the aluminium-doped metal-containing layer in the first MOS region M1A. The conductive capping layer may include TiN, TaN, or a combination thereof. The conductive capping layer in the second MOS region M1B may be omitted. The gap-filling metal layer may include tungsten (W) or TiN, but it is not limited thereto.

In the integrated circuit device 400, one active region of the active region AC1A in the first MOS region M1A and the active region AC1B in the second MOS region M1B may include a semiconductor layer epitaxially grown from a portion of another active region. For example, a portion of the semiconductor substrate 110 formed of a III-V group material may include an epitaxially grown Ge layer. Therefore, the semiconductor substrate 110 formed of the III-V group material may provide the active region AC1A in the first MOS region M1A and the Ge layer may provide the active region AC1B in the second MOS region M1B. In another example embodiment, a portion of the semiconductor substrate 110 formed of a Ge material may include an epitaxially grown III-V semiconductor layer. Therefore, the semiconductor substrate 110 formed of the Ge material may provide the active region AC1B in the second MOS region M1B and the III-V semiconductor layer may provide the active region AC1A in the first MOS region M1A.

Figure 7:
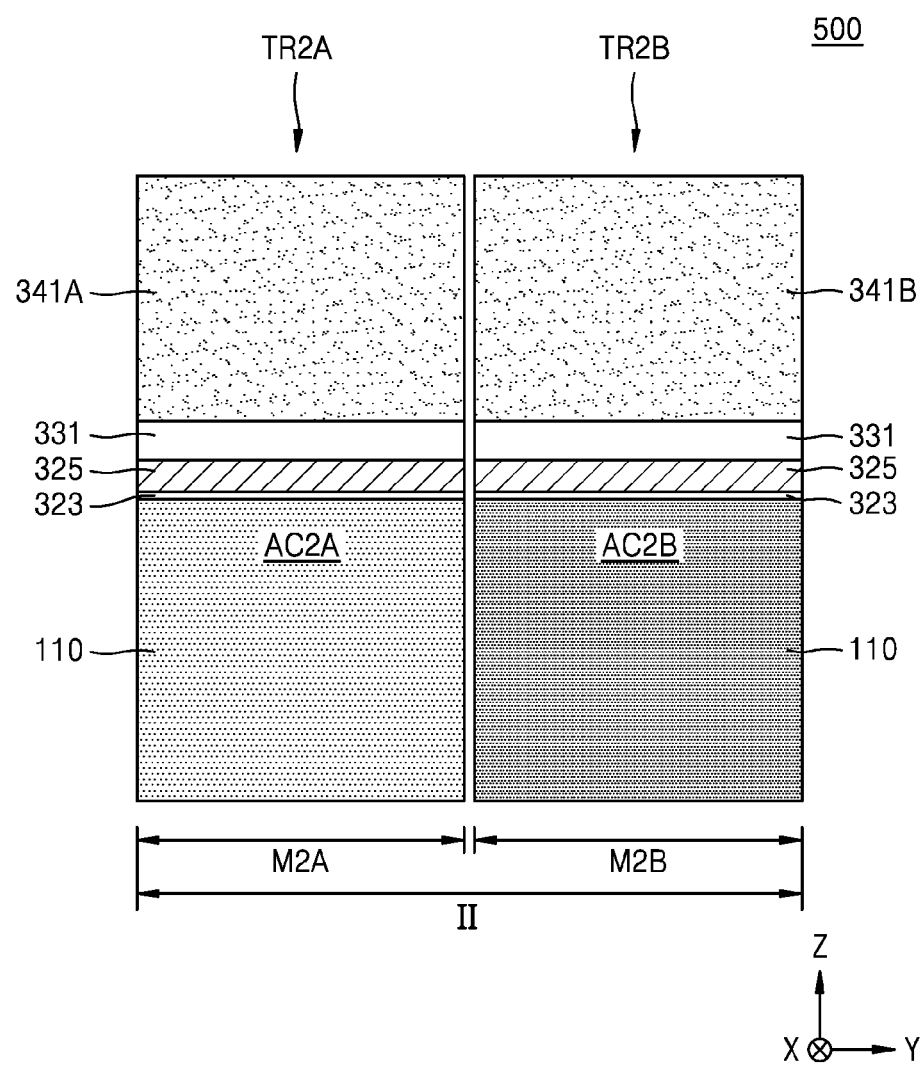

FIG. 7 is a cross-sectional view illustrating essential parts of an integrated circuit device 500 according to an example embodiment of the inventive concepts. In FIG. 7, the same reference numerals as those illustrated in FIGS. 1 through 5 denote the same elements and a discussion thereof will not be given.

Referring to FIG. 7, a second region II of the integrated circuit device 500 may include a first MOS region M2A for forming a first conductivity channel type transistor TR2A and a second MOS region M2B for forming a second conductivity channel type transistor TR2B. The second region II illustrated in FIG. 4 may be any one of the first MOS region M2A and the second MOS region M2B illustrated in FIG. 7.

The first conductivity type and the second conductivity type may be different from each other. For example, when the first conductivity type is N-type, the second conductivity type is P-type. Conversely, when the first conductivity type is P-type, the second conductivity type is N-type.

In an example embodiment, the first conductivity channel type transistor TR2A may be an N channel type transistor, and the second conductivity channel type transistor TR2B may be a P channel type transistor. In this case, the substrate 110 of the first MOS region M2A may include an active region AC2A formed of a III-V group material and the substrate 110 of the second MOS region M2B may include an active region AC2B formed of a IV group material. For example, the active region AC2A in the first MOS region M2A may include InP, $In_zGa_{1-z}As$ (0≤z≤1), or $Al_zGa_{1-z}As$ (0≤z≤1). The active region AC2B in the second MOS region M2B may include Ge.

In an example embodiment, a gate electrode 341A of the first conductivity channel type transistor TR2A in the first MOS region M2A may have substantially the same structure as the gate electrode 340A described with reference to FIG. 6. In an example embodiment, a gate electrode 341B of the second conductivity channel type transistor TR2B in the second MOS region M2B may have substantially the same structure as the gate electrode 340B described with reference to FIG. 6.

In the integrated circuit device 500, one active region of the active region AC2A in the first MOS region M2A and the active region AC2B in the second MOS region M2B may include a semiconductor layer epitaxially grown from a portion of another active region. For example, a portion of the semiconductor substrate 110 formed of a III-V group material may include an epitaxially grown Ge layer. Therefore, the semiconductor substrate 110 formed of the III-V group material may provide the active region AC2A in the first MOS region M2A and the Ge layer may provide the active region AC2B in the second MOS region M2B. In another example embodiment, a portion of the semiconductor substrate 110 formed of a Ge material may include an epitaxially grown III-V semiconductor layer. Therefore, the semiconductor substrate 110 formed of the Ge material may provide the active region AC2B in the second MOS region M2B and the III-V semiconductor layer may provide the active region AC2A in the first MOS region M2A.

FIGS. 8A through 8G are cross-sectional views illustrating process steps of a method of manufacturing an integrated circuit device according to an example embodiment of the inventive concepts.

A method of manufacturing an integrated circuit device according to an example embodiment of the inventive concepts with reference to FIGS. 8A through 8G will be illustrated. As an example, a method of manufacturing the integrated circuit device 300 illustrated in FIG. 4 will be illustrated. In FIGS. 8A through 8G, the same reference numerals as those illustrated in FIGS. 1 through 7 denote the same elements and a discussion thereof will not be given.

Figure 8A:
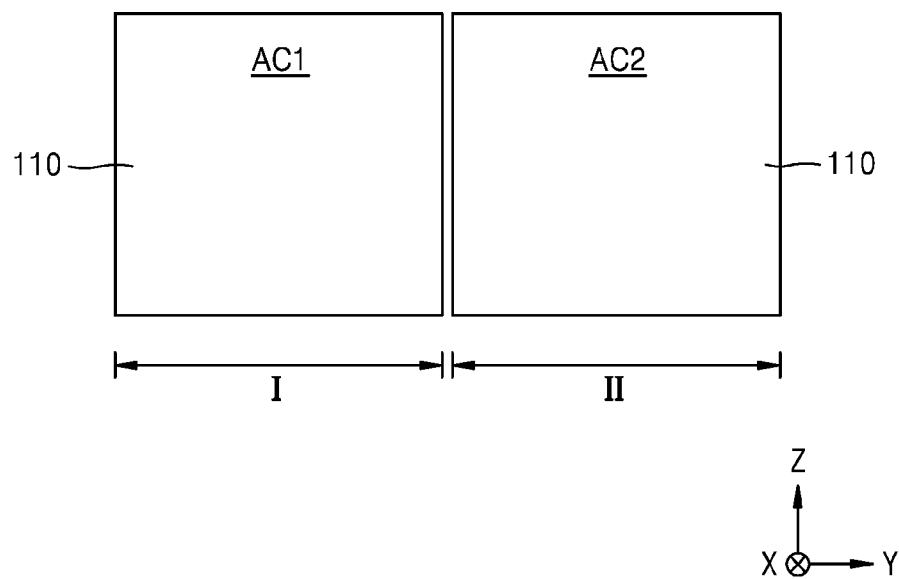
FIGS. 8A through 8G are cross-sectional views illustrating process steps of a method of manufacturing an integrated circuit device according to an example embodiment of the inventive concepts.

Referring to FIG. 8A, a semiconductor substrate 110 including a first region I and a second region II may be provided.

The semiconductor substrate 110 may include a first active region AC1 in the first region I and a second active region AC2 in the second region II.

Figure 8B:
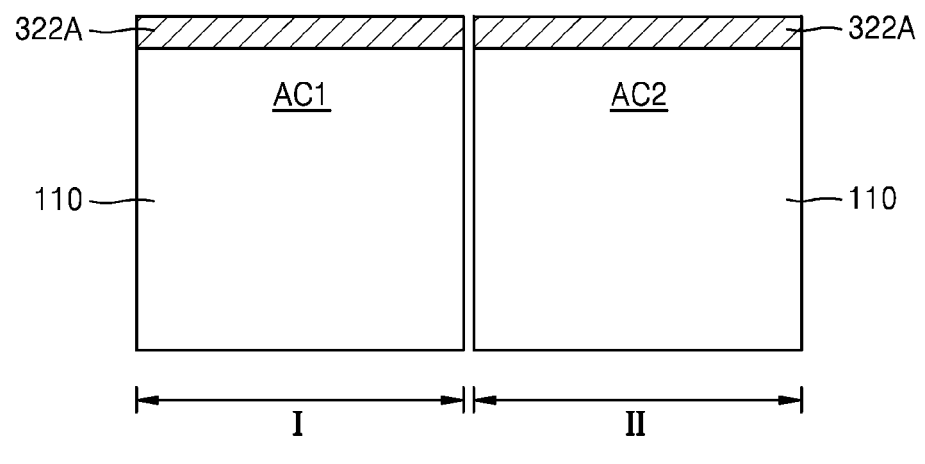

Referring to FIG. 8B, a first insulating layer 322A may be formed on the semiconductor substrate 110 including the first region I and the second region II to cover the first active region AC1 and the second active region AC2.

The first insulating layer 322A may be formed of a material having a dielectric constant equal to or less than 10 (e.g., ranging from 1 to 10). In an example embodiment, the first insulating layer 322A may include an aluminum oxide ($Al_2O_3$) layer, a silicon oxide ($SiO_2$) layer, a silicon oxynitride (SiON) layer, a silicon nitride ($Si_3N_4$) layer, or a combination thereof. In an example embodiment, the first insulating layer 322A may be formed to have a thickness ranging from 10 Å to 20 Å in the first region I and the second region II, but it is not limited thereto.

In an example embodiment, the first insulating layer 322A may be formed through an atomic layer deposition (ALD) process, a chemical vapour deposition (CVD) process, or a physical vapour deposition (PVD) process.

Figure 8C:
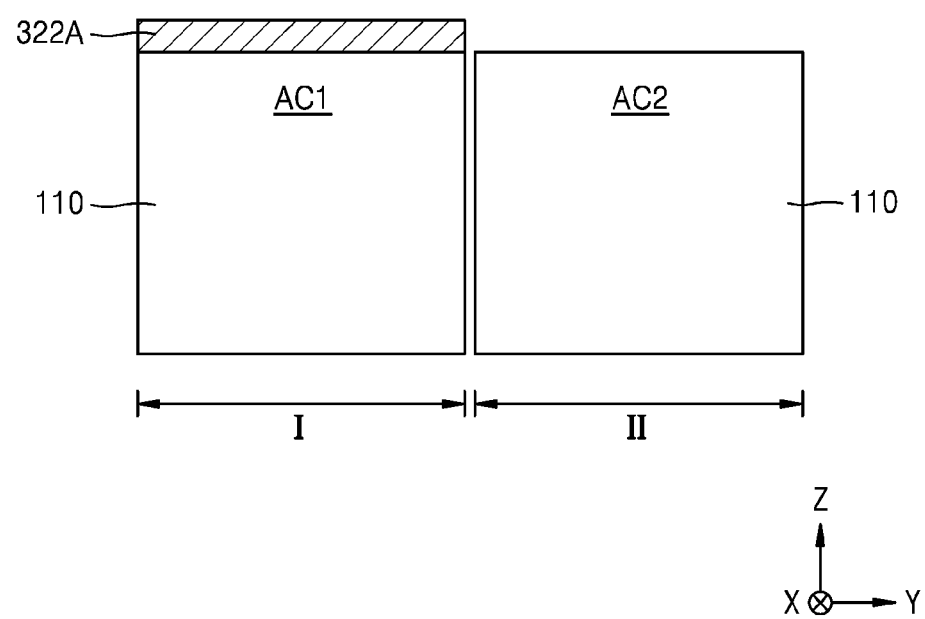

Referring to FIG. 8C, through selectively removing the first insulating layer 322A in the second region II, the first insulating layer 322A in the first region I may remain and a top surface of the semiconductor substrate 110 in the second region II (i.e., a top surface in the second active region AC2) may be exposed.

The first insulating layer 322A may be selectively removed through a dry etch process, and/or a wet etch process.

Figure 8D:
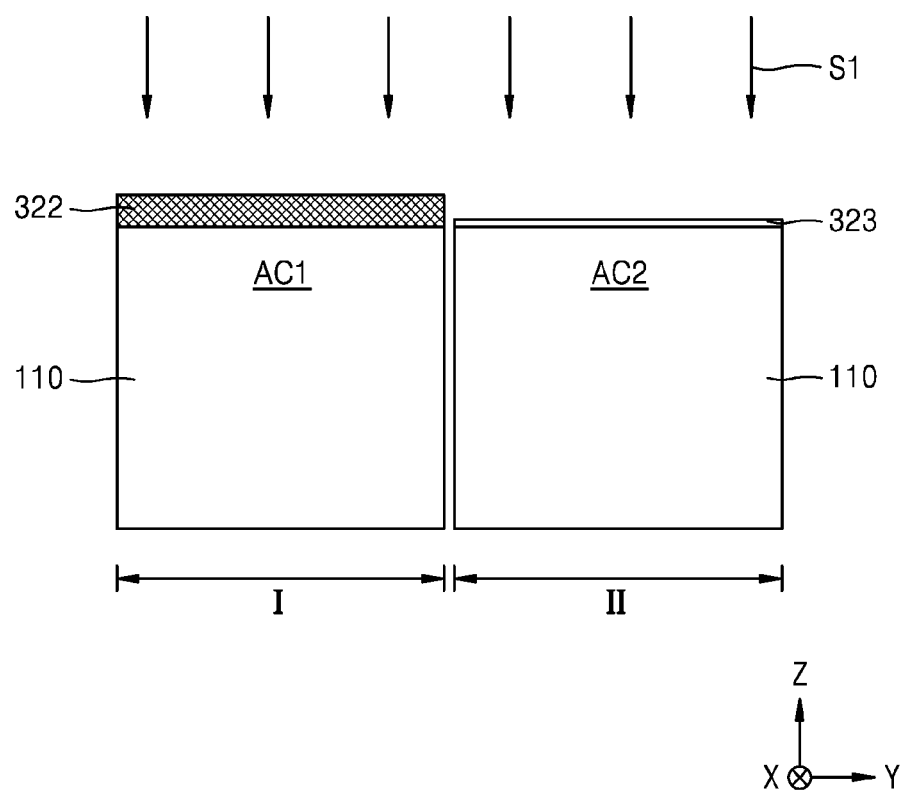

Referring to FIG. 8D, respective top surfaces of the first insulating layer 322A in the first region I and the semiconductor substrate 110 in the second region II may be exposed to a chalcogen element-containing compound S1 having an atomic weight equal to or greater than 16 (e.g., ranging from 16 to 52) such that a lower insulating layer 322 doped with a chalcogen element having an atomic weight equal to or greater than 16 (e.g., ranging from 16 to 52) is formed from the first insulating layer 322A in the first region I and a passivation layer 323 is formed on the top surface of the semiconductor substrate 110 in the second region II.

A process for exposing the first insulating layer 322A in the first region I and the top surface of the semiconductor substrate 110 in the second region II to the chalcogen element-containing compound S1 may be performed through a dry process, or a wet process.

In an example embodiment, prior to exposing the first insulating layer 322A in the first region I and the top surface of the semiconductor substrate 110 in the second region II to the chalcogen element-containing compound S1, a process for removing a native oxide formed on the first insulating layer 322A in the first region I and the top surface of the semiconductor substrate 110 in the second region II or a cleaning process may be performed using HCl, HF, $NH_4OH$, $H_2$, or a hydrogen plasma.

In an example embodiment, the chalcogen element-containing compound S1 may be a sulfur-containing material. The chalcogen element-containing compound S1 may be used in a gas state, in a liquid state, or in a solid state. When the chalcogen element-containing compound S1 is in a liquid state, or in a solid state, the chalcogen element-containing compound S1 may be vaporized before supplying the chalcogen element-containing compound S1 on the first insulating layer 322A in the first region I and the top surface of the semiconductor substrate 110 in the second region II.

For example, the chalcogen element-containing compound S1 may be a sulfur compound, for example, $H_2S$, $S_2Cl_2$, $(NH_4)_2S$, $(NH_4)HS$, or an organic sulfur compound. The organic sulfur compound may include $SC(NH_2)_2$, but it is not limited thereto.

In an example embodiment, the first insulating layer 322A in the first region I and the top surface of the semiconductor substrate 110 in the second region II may be sulfur-treated through exposing the first insulating layer 322A in the first region I and the top surface of the semiconductor substrate 110 in the second region II to vapour of $(NH_4)_2S$ at room temperature and atmospheric pressure for 5 minutes to 30 minutes.

In another example embodiment, the sulfur treatment of the first insulating layer 322A in the first region I and the top surface of the semiconductor substrate 110 in the second region II may be performed in such a way that the first insulating layer 322A in the first region I and the top surface of the semiconductor substrate 110 in the second region II are exposed to vapour of $(NH_4)_2S$ in the chamber maintained at a pressure ranging from 1 to 10 torr and a temperature ranging from 20° C. to 400° C. for several seconds to several tens of minutes. In an example embodiment, heat or plasma may be applied in the chamber.

In an example embodiment, after removing a native oxide layer from the first insulating layer 322A in the first region I and the top surface of the semiconductor substrate 110 in the second region II using a HCl solution, the sulfur treatment of the first insulating layer 322A in the first region I and the top surface of the semiconductor substrate 110 in the second region II may be performed in such a way that the first insulating layer 322A in the first region I and the top surface of the semiconductor substrate 110 in the second region II are exposed to a solution of $(NH_4)_2S$ for several seconds to several tens of minutes.

In an example embodiment, the sulfur treatment of the first insulating layer 322A in the first region I and the top surface of the semiconductor substrate 110 in the second region II may be performed in such a way that the first insulating layer 322A in the first region I and the top surface of the semiconductor substrate 110 in the second region II are dipped in a water solution of $(NH_4)_2S$ of 5 weight percent to 25 weight percent for 2 minutes to 20 minutes. In this case, the water solution of $(NH_4)_2S$ may be maintained at a temperature ranging from 20° C. to 60° C.

As described above, through sulfur-treating the first insulating layer 322A in the first region I and the top surface of the semiconductor substrate 110 in the second region II using the sulfur compound of the chalcogen element-containing compound S1, the sulfur-doped lower insulating layer 322 may be formed from the first insulating layer 322A in the first region I and the sulfur passivation layer 323 may be formed on the top surface of the semiconductor substrate 110 in the second region II.

Figure 8E:
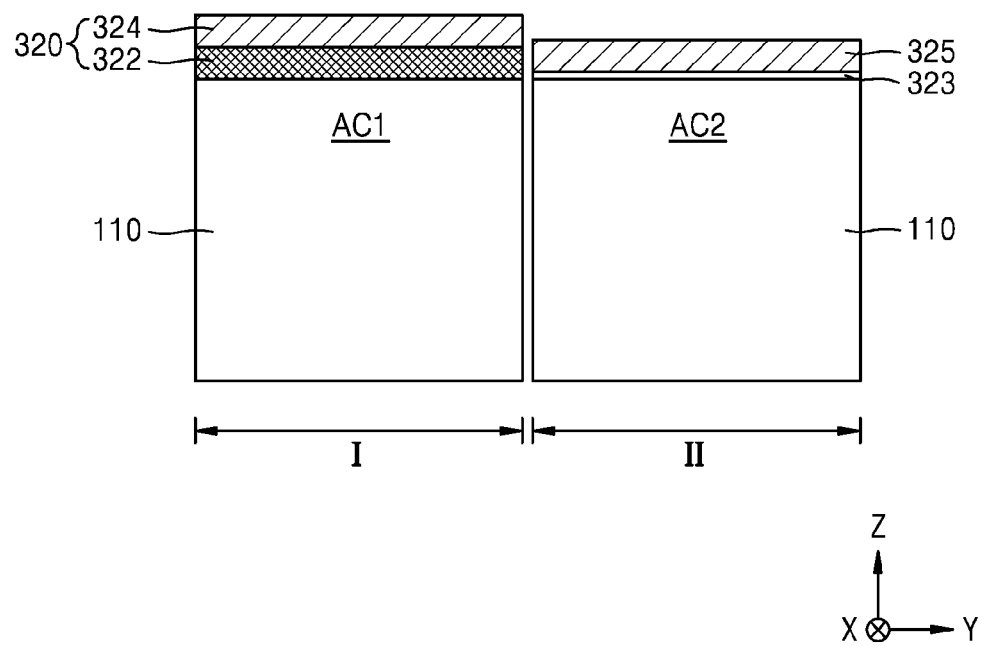
Figure 8F:
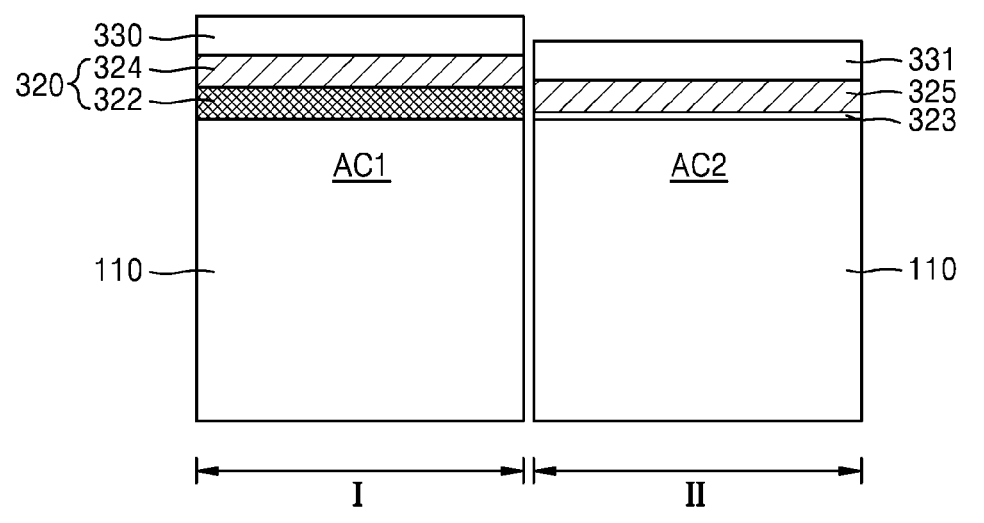

Referring to FIG. 8E, a second insulating layer 324 and 325 may be formed in the first region I and the second region II so as to cover the lower insulating layer 322 and the passivation layer 323. The second insulating layer 324 in the first region I may correspond to an upper insulating layer 324 constituting a first interfacial layer 320 together with the lower insulating layer 322. The second insulating layer 325 in the second region II may constitute a second interfacial layer 325. The upper insulating layer 324 in the first region I and the second interfacial layer 325 in the second region II may be concurrently formed through forming the second insulating layer 324 and 325.

Accordingly, an interfacial structure including the first interfacial layer 320 that a part of the total thickness thereof is doped with sulfur in the first region I, the passivation layer 323 covering the top surface of the semiconductor substrate 110 in the second region II, and the second interfacial layer 325 covering the passivation layer 323 in the second region II may be formed. The first interfacial layer 320 having a relatively thick thickness and the second interfacial layer 325 having a relatively thin thickness may be concurrently formed through a simplified process. Furthermore, through passivating the top surfaces of the semiconductor substrate 110 in the first region I and the second region II (i.e., the top surfaces of the first and the second active regions AC1 and AC2) by the chalcogen element (e.g., sulfur), a surface defect thereof may be cured and thus, electric characteristics thereof may be improved.

The second insulating layer 324 and 325 may not include a chalcogen element having an atomic weight equal to or greater than 16 (e.g., ranging from 16 to 52). In an example embodiment, the second insulating layer 324 and 325 may be formed of a material having a dielectric constant equal to or less than 10 (e.g., ranging from 1 to 10). For example, the second insulating layer 324 and 325 may include an aluminum oxide ($Al_2O_3$) layer, a silicon oxide ($SiO_2$) layer, a silicon oxynitride (SiON) layer, an aluminum silicon oxide (AlSiOx, x>0) layer, or a combination thereof.

The second insulating layer 324 and 325 may be formed through an ALD process, a CVD process, or a PVD process. The second insulating layer 324 and 325 may have a thickness ranging from 10 Å to 20 Å, but it is not limited thereto.

Referring to 8F, a first gate insulation layer 330 covering the first interfacial layer 320 in the first region I and a second gate insulation layer 331 covering the second interfacial layer 325 in the second region II may be concurrently formed.

The first gate insulation layer 330 and the second gate insulation layer 331 may be formed of a material having a dielectric constant ranging from 10 to 25. The first gate insulation layer 330 and the second gate insulation layer 331 may be formed through an ALD process, a CVD process, or a PVD process. The first gate insulation layer 330 and the second gate insulation layer 331 may have a thickness ranging from 10 Å to 20 Å, but it is not limited thereto. Details of the first gate insulation layer 330 and the second gate insulation layer 331 are substantially the same as those of the gate insulation layer 130 described with reference to FIG. 1.

Figure 8G:
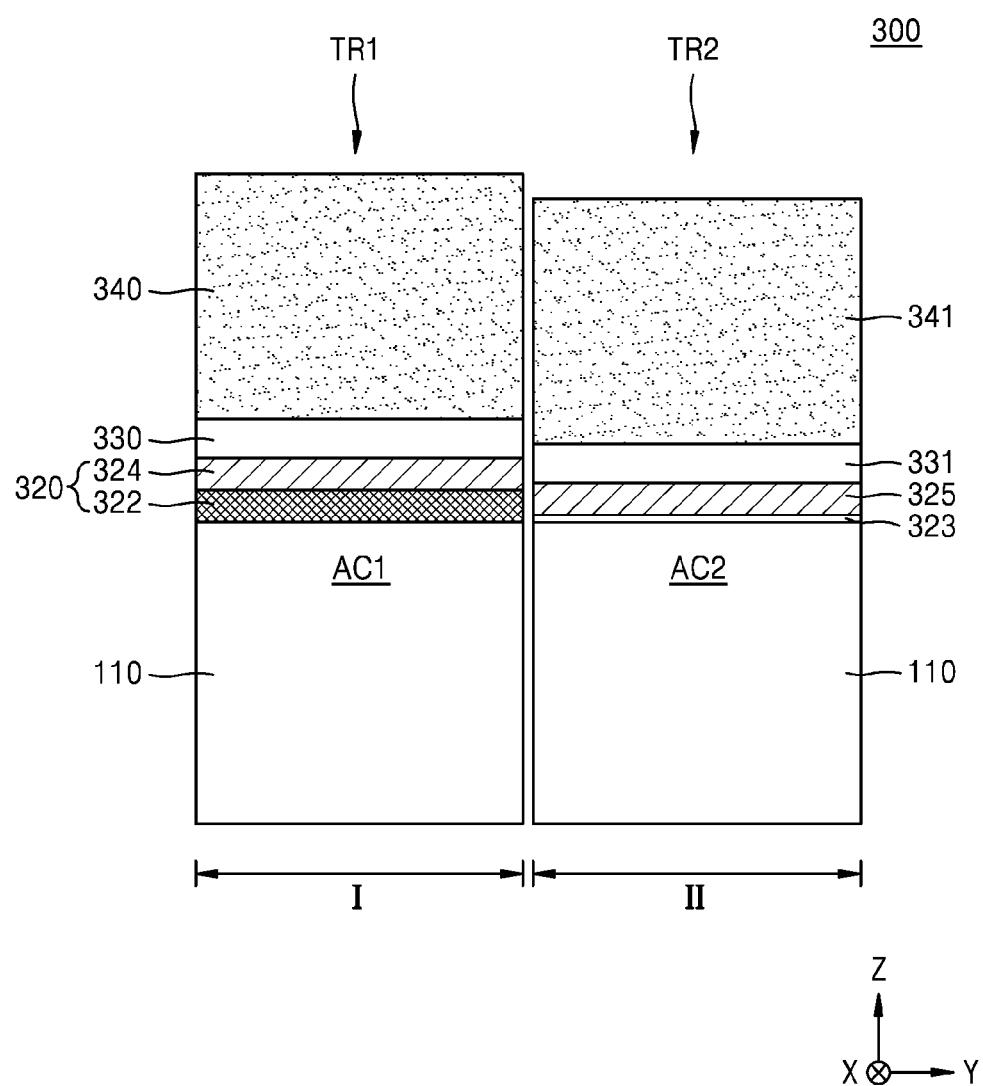

Referring to FIG. 8G, a first gate electrode 340 covering the first gate insulation layer 330 in the first region I and a second gate electrode 341 covering the second gate insulation layer 331 in the second region II may be formed.

The first gate electrode 340 and the second gate electrode 341 may be formed through an ALD process, a metal organic ALD process, or a metal organic CVD process.

As described above, the method of manufacturing the integrated circuit device 300 illustrated in FIG. 4 is explained with reference to FIGS. 8A through 8G, but the integrated circuit device 100 illustrated in FIG. 1, the integrated circuit device 400 illustrated in FIG. 6, the integrated circuit device 500 illustrated in FIG. 7, and other integrated circuit devices having similar structures may be manufactured by adding various modifications and changes within the scope of the inventive concepts from those described with reference to FIGS. 8A to 8G.

Figure 9:
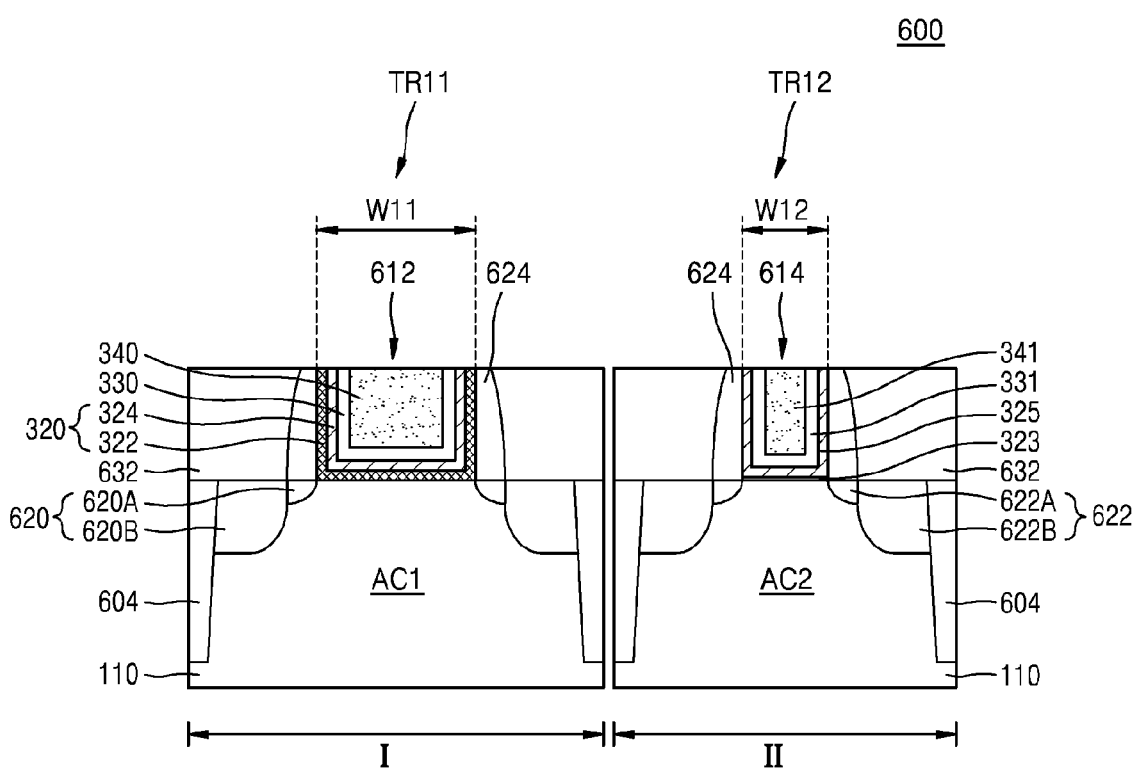

FIG. 9 illustrates a cross-sectional view of an integrated circuit device 600 according to an example embodiment of the inventive concepts. An example of the integrated circuit device 600 having a structure of a planar-type field effect transistor (FET) is illustrated with reference to FIG. 9. In FIG. 9, the same reference numerals as those illustrated in FIGS. 1 through 7 denote the same elements and a discussion thereof will not be given.

Referring to FIG. 9, the integrated circuit device 600 may include a device isolation layer 604 delimiting the first active region AC1 in the first region I of the semiconductor substrate 110 and the second active region AC2 in the second region II of the semiconductor substrate 110. The device isolation layer 604 may be formed of silicon oxide, silicon nitride, or a combination thereof.

A first transistor TR11 may be formed on the first active region AC1 and a second transistor TR12 may be formed on the second active region AC2.

The first transistor TR11 may have a first gate structure 612 including the first interfacial layer 320, the gate insulation layer 330, and the first gate electrode 340 sequentially stacked on the first active region AC1. The first interfacial layer 320 may have a double layer structure including the lower insulating layer 322 formed on the first active region AC1 and doped with a chalcogen element having an atomic weight equal to or greater than 16 (e.g., ranging from 16 to 52) and the upper insulating layer 324 covering the lower insulating layer 322.

The second transistor TR12 may have a second gate structure 614 including the passivation layer 323, the second interfacial layer 325, the second gate insulation layer 331, and the second gate electrode 341 sequentially stacked on the second active region AC2.

The first gate structure 612 and the second gate structure 614 may be formed through a gate-last process (i.e., a replacement poly-gate process), but it is not limited thereto.

The first gate structure 612 and the second gate structure 614 may have different widths W11 and W12 from each other. In other words, the first gate structure 612 in the first region I may have a first width W11 and the second gate structure 614 in the second region II may have a second width W12 less than the first width W11. Accordingly, a channel length in the first active region AC1 defined by the first transistor TR11 may be greater than a channel length in the second active region AC2 defined by the second transistor TR12. Furthermore, a threshold voltage of the first transistor TR11 may be greater than a threshold voltage of the second transistor TR12.

Opposite sidewalls of each of the first gate structure 612 and the second gate structure 614 may be covered with insulating spacers 624. The insulating spacers 624 each may include silicon nitride, silicon oxynitride, or a combination thereof.

Each of the first interfacial layer 320 and the first gate insulation layer 330 may extend to cover a bottom surface and opposite sidewalls of the first gate electrode 340 in the first region I. In other words, the first interfacial layer 320 and the first gate insulation layer 330 may be disposed between the first gate electrode 340 and the first active region AC1, and between the first gate electrode 340 and the insulating spacers 624.

In the second region II, the passivation layer 323 may be disposed between the second active region AC2 and the second interfacial layer 325. The second interfacial layer 325 and the second gate insulation layer 331 may extend to be disposed between the second gate electrode 341 and the second active region AC2, and between the second gate electrode 341 and the insulating spacers 624.

First source/drain regions 620 may be formed in the first active region AC1 at opposite sides of the first gate electrode 340. The first source/drain region 620 may include a first source/drain extension region 620A and a first deep source/drain region 620B.

Second source/drain regions 622 may be formed in the second active region AC2 at opposite sides of the second gate electrode 341. The second source/drain region 622 may include a second source/drain extension region 622A and a second deep source/drain region 622B.

The first source/drain region 620 and the second source/drain region 622 may be covered with an inter-gate insulating layer 632. The inter-gate insulating layer 632 may be formed of silicon oxide, but it is not limited thereto.

Figure 10:
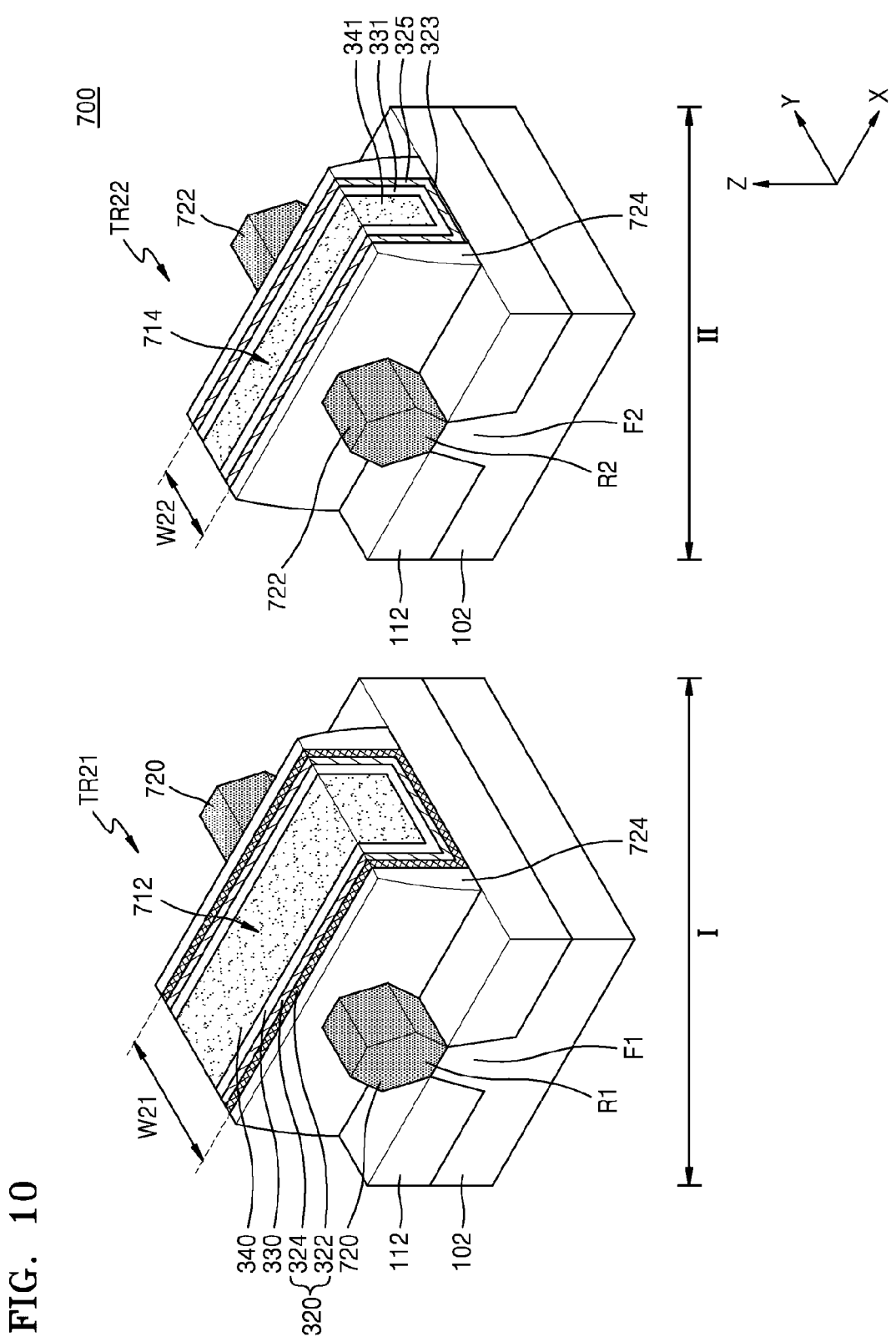

FIG. 10 is a perspective view of an integrated circuit device 700 according to an example embodiment of the inventive concepts. An example of the integrated circuit device 700 having a fin-shaped field effect transistor (FinFET) structure is illustrated with reference to FIG. 10. In FIG. 10, the same reference numerals as those illustrated in FIGS. 1 through 7 denote the same elements and a discussion thereof will not be given.

Referring to FIG. 10, the integrated circuit device 700 may include a first fin-shaped active region F1 protruding from a semiconductor substrate 102 of the first region I in a direction (Z direction) perpendicular to a main surface of the semiconductor substrate 102 and a second fin-shaped active region F2 protruding from a semiconductor substrate 102 of the second region II in the direction (Z direction) perpendicular to the main surface of the semiconductor substrate 102. FIG. 10 illustrates the first fin-shaped active region F1 and the second fin-shaped active region F2 extending in a direction (Y direction) parallel to the main surface of the substrate 102, but it is not limited thereto. For example, the first fin-shaped active region F1 and the second fin-shaped active region F2 may extend in different directions from each other. Respective materials of the semiconductor substrate 102, the first fin-shaped active region F1 and the second fin-shaped active region F2 may be substantially the same as that of the semiconductor substrate 110 described with reference to FIG. 1.

Respective lower portions of the first fin-shaped active region F1 and the second fin-shaped active region F2 may be covered with a device isolation layer 112 formed on the semiconductor substrate 102.

A first transistor TR21 may be formed on the first fin-shaped active region F1 and a second transistor TR22 may be formed on the second fin-shaped active region F2. An upper portion of the first fin-shaped active region F1 may be provided as an active region for the first transistor TR21 and an upper portion of the second fin-shaped active region F2 may be provided as an active region for the second transistor TR22.

The first transistor TR21 may include a first gate structure 712 covering a top surface and opposite sidewalls of the first fin-shaped active region F1 and extending in a direction crossing the first fin-shaped active region F1. The first gate structure 712 may include the first interfacial layer 320, the first gate insulation layer 330, and the first gate electrode 340 sequentially stacked on the first fin-shaped active region F1. The first interfacial layer 320 may have a double layer structure including the lower insulating layer 322 formed on the first active region AC1 and doped with a chalcogen element having an atomic weight equal to or greater than 16 (e.g., ranging from 16 to 52) and the upper insulating layer 324 covering the lower insulating layer 322.

The second transistor TR22 may include a second gate structure 714 covering a top surface and opposite sidewalls of the second fin-shaped active region F2 and extending in a direction crossing the second fin-shaped active region F2. The second gate structure 714 may include the passivation layer 323, the second interfacial layer 325, the second gate insulation layer 331, and the second gate electrode 341 sequentially stacked on the second fin-shaped active region F2.

The first gate structure 712 and the second gate structure 714 may be formed through a gate-last process, but it is not limited thereto.

FIG. 10 illustrates the first gate structure 712 and the second gate structure 714 extending in a direction (X direction) parallel to the main surface of the substrate 102, but it is not limited thereto. For example, the first gate structure 712 and the second gate structure 714 may extend in different directions from each other.

The first gate structure 712 and the second gate structure 714 may have different widths W21 and W22 from each other. In other words, the first gate structure 712 in the first region I may have a first width W21 and the second gate structure 714 in the second region II may have a second width W22 less than the first width W21. A threshold voltage of the first transistor TR21 may be greater than a threshold voltage of the second transistor TR22.

The first transistor TR21 may include a plurality of first source/drain regions 720 formed in the first fin-shaped active region F1 at opposite sides of the first gate structure 712. The second transistor TR22 may include a plurality of second source/drain regions 722 formed in the second fin-shaped active region F2 at opposite sides of the second gate structure 714. In FIG. 10, the first source/drain region 720 and the second source/drain region 722 each may have a raised source/drain (RSD) structure, but it is not limited thereto. For example, each of the first source/drain region 720 and the second source/drain region 722 may be an impurity doped region.

To form the first and second source/drain regions 720 and 722 having the RSD structure illustrated in FIG. 10, after forming recesses R1 and R2 by partially removing each of the first and second fin-shaped active regions F1 and F2, a semiconductor layer for forming the first and second source/drain regions 720 and 722 may be formed in the recesses R1 and R2 using an epitaxial growth process. In an example embodiment, the first and second source/drain regions 720 and 722 may be formed of Si, SiC, or SiGe, but it is not limited thereto. Each of the first and second source/drain regions 720 and 722 may have a top surface disposed at a level higher than those of respective top surfaces of the first and second fin-shaped active regions F1 and F2.

Opposite sidewalls of each of the first gate structure 712 and the second gate structure 714 may be covered with insulating spacers 724. The insulating spacers 724 each may include silicon nitride, silicon oxynitride, or a combination thereof. The first source/drain region 720 may be spaced apart from the first gate structure 712 by the insulating spacer 724 interposed therebetween. The second source/drain region 722 may be spaced apart from the second gate structure 714 by the insulating spacer 724 interposed therebetween.

Figure 11A:
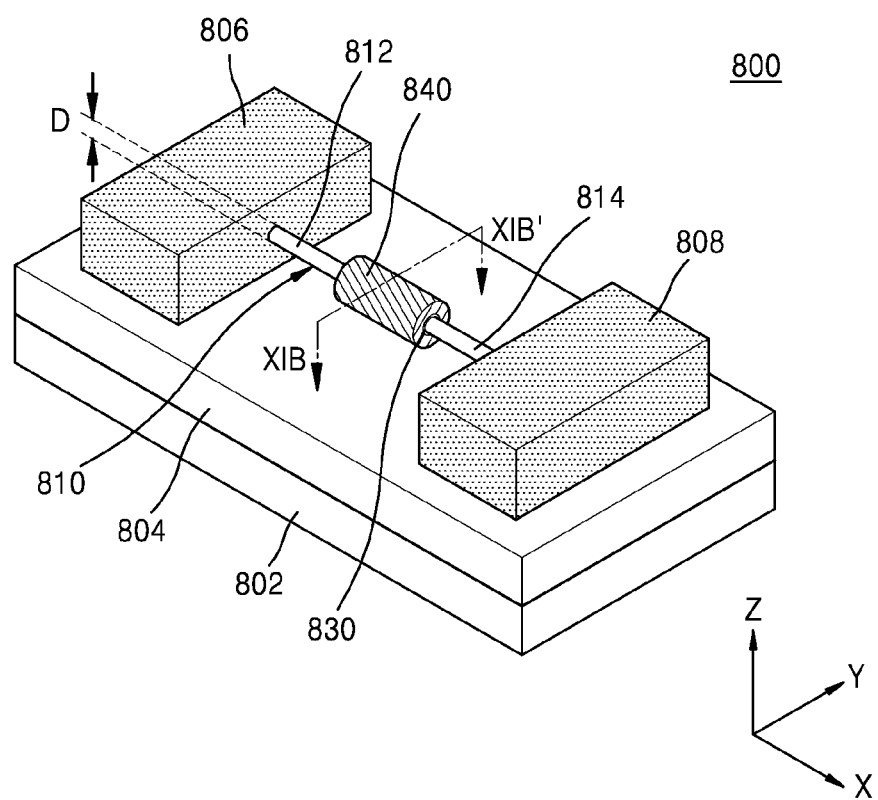
FIG. 11A is a perspective view of an integrated circuit device according to an example embodiment of the inventive concepts.
Figure 11B:
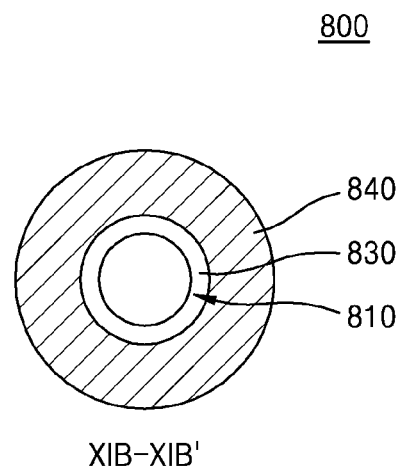
FIG. 11B is a cross-sectional view taken along a line XIB-XIB' of FIG. 11A.

FIG. 11A is a perspective view of an integrated circuit device 800 according to an example embodiment of the inventive concepts. FIG. 11B is a cross-sectional view taken along a line XIB-XIB' of FIG. 11A. In FIGS. 11A and 11B, the same reference numerals as those illustrated in FIGS. 1 through 7 denote the same elements and a discussion thereof will not be given.

Referring to FIGS. 11A and 11B, the integrated circuit device 800 may include a first pad region 806 and a second pad region 808 disposed on an insulating layer 804 formed on the base substrate 802.

The base substrate 802 may include a semiconductor element (e.g., Si or Ge), or a compound semiconductor material (e.g., SiC, GaAs, InAs or InP). The insulating layer may be formed of oxide.

The first pad region 806 and the second pad region 808 may be connected to each other through a semiconductor body 810 of a nanowire shape. The semiconductor body 810 may extend in a direction (X direction) parallel to a main surface of the base substrate 802 between the first pad region 806 and the second pad region 808.

The first pad region 806, the second pad region 808 and the semiconductor body 810 may be integrally formed. The first pad region 806, the second pad region 808 and the semiconductor body 810 may have the same material as that of the semiconductor substrate 110 described with reference to FIG. 1.

In an example embodiment, the semiconductor body 810 may have a diameter D of about 30 nm or less. For example, the semiconductor body 810 may have a diameter of about 20 nm or less.

The integrated circuit device 800 may include an insulation layer structure 830 surrounding the semiconductor body 810 and a gate electrode 840 formed on the insulation layer structure 830 to cover the semiconductor body 810.

In an example embodiment, the insulation layer structure 840 may include the interfacial layer 120 and the gate insulation layer 130 described with reference to FIG. 1, or the first interfacial layer 320 and the first gate insulation layer 330 described with reference to FIG. 4. In another example embodiment, the insulation layer structure 840 may include the passivation layer 323, the second interfacial layer 325, and the second gate insulation layer 331 described with reference to FIG. 4.

The gate electrode 840 may have substantially the same material as the gate electrode 140 described with reference to FIG. 1.

A source region 812 and a drain region 814 may be formed in the semiconductor body 810 at opposite sides of the gate electrode 840 through an impurity doping process.

Figure 12:
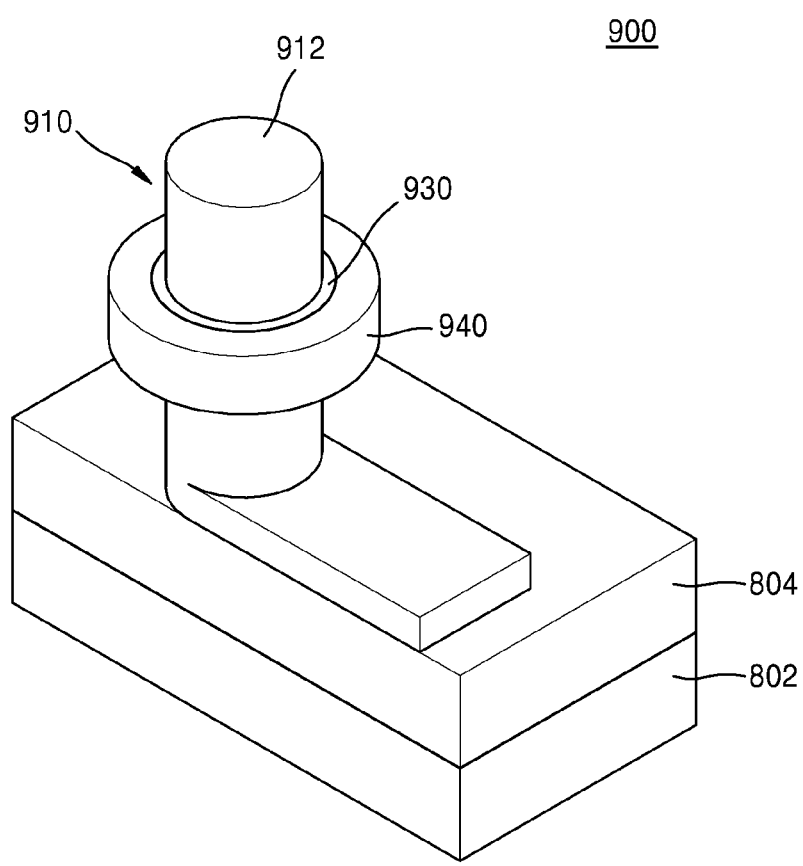

FIG. 12 is a perspective view of an integrated circuit device 900 according to an example embodiment of the inventive concepts. In FIG. 12, the same numerals as those illustrated in FIGS. 1 through 11B denote the same elements and a discussion thereof will not be given.

Referring to FIG. 12, the integrated circuit device 900 may include a semiconductor layer 910 disposed on the insulating layer 804 formed on the base substrate 802. The semiconductor layer 910 may include a semiconductor body 912 extending in a direction perpendicular to the main surface of the base substrate 802. The integrated circuit device 900 may include an insulation layer structure 930 surrounding the semiconductor body 912 and a gate electrode 940 formed on the insulation layer structure 930 to cover the semiconductor body 912.

In an example embodiment, the insulation layer structure 940 may include the interfacial layer 120 and the gate insulation layer 130 described with reference to FIG. 1, or the first interfacial layer 320 and the first gate insulation layer 330 described with reference to FIG. 4. In another example embodiment, the insulation layer structure 940 may include the passivation layer 323, the second interfacial layer 325, and the second gate insulation layer 331 described with reference to FIG. 4.

The gate electrode 940 may have substantially the same material as the gate electrode 140 described with reference to FIG. 1.

Source/drain regions may be formed in the semiconductor body 912 at opposite sides of the gate electrode 940 through an impurity doping process.

According to example embodiments of the inventive concepts, an integrated circuit device may provide a structure capable of independently securing optimal reliability and performance depending on the use of a transistor constituting a highly scaled semiconductor device. In particular, in the integrated circuit devices 600, 700, 800 and 900 illustrated in FIGS. 9 through 12, through concurrently forming a transistor having a relatively thick interfacial layer constituting a peripheral circuit device requiring high voltage operation and high reliability such as an I/O (input/output) device and another transistor having a relatively thin interfacial layer constituting a logic cell requiring low power consumption and high speed operation, an integrated circuit device having a structure capable of providing a high reliability and/or high performance transistor according to the use of a transistor may be effectively manufactured through a simplified process.

Figure 13:
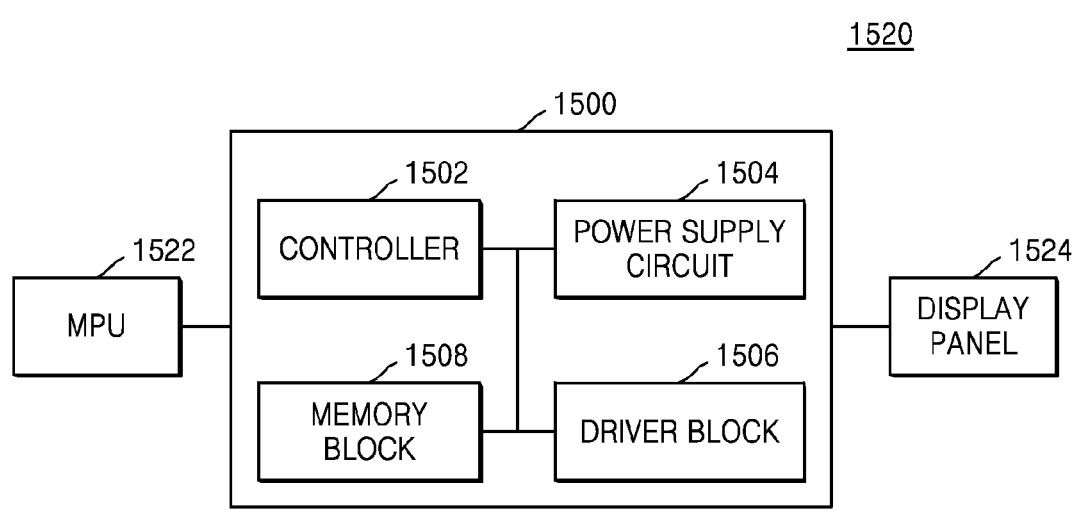

FIG. 13 is a schematic block diagram of a display device 1520 including a display driver IC (DDI) 1500 according to an example embodiment of the inventive concepts.

Referring to FIG. 13, the DDI 1500 may include a controller 1502, a power supply circuit 1504, a driver block 1506, and a memory block 1508. The controller 1502 may receive and decode commend applied from a main processing unit (MPU) 1522 and may control respective blocks of the DDI 1500 to implement an operation according to commend. The power supply circuit 1504 may generate a driving voltage in response to the control of the controller 1502. The driver block 1506 may drive a display pannel 1524 using the driving voltage generated from the power supply circuit 1504 in response to the control of the controller 1502. The display pannel 1524 may be a liquid crystal display pannel, a plasma display pannel, or an organic light emitting diodes (OLED) display pannel. The memory block 1508 may include a memory (e.g., RAM, ROM) as a block temporarily storing a commend input to the controller 1502 or a control signal output from the controller 1502, or storing necessary data. At least one of the power supply circuit 1504 and the driver block 1506 may include at least one of the integrated circuit devices 100, 200, 300, 400, 500, 600, 700, 800, and 900 according to example embodiments of the inventive concepts described with reference to FIGS. 1 through 12 and modified integrated circuit devices within the scope of the inventive concepts from these.

Figure 14:
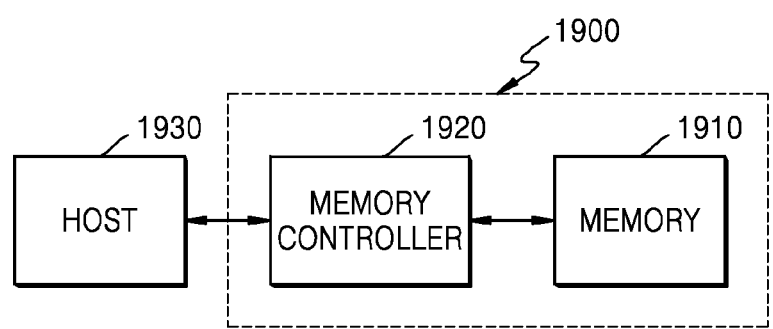

FIG. 14 is a block diagram illustrating an electronic system 1900 according to an example embodiment of the inventive concepts.

The electronic system 1900 may include a memory 1910 and a memory controller 1920. The memory controller 1920 may control the memory 1910 for data reading from the memory 1910 and/or data writing to memory 1910 in response to a request of a host 1930. The At least one of the memory 1910 and the memory controller 1920 may include at least one of the integrated circuit devices 100, 200, 300, 400, 500, 600, 700, 800, and 900 according to example embodiments of the inventive concepts described with reference to FIGS. 1 through 12 and modified integrated circuit devices within the scope of the inventive concepts from these.

Figure 15:
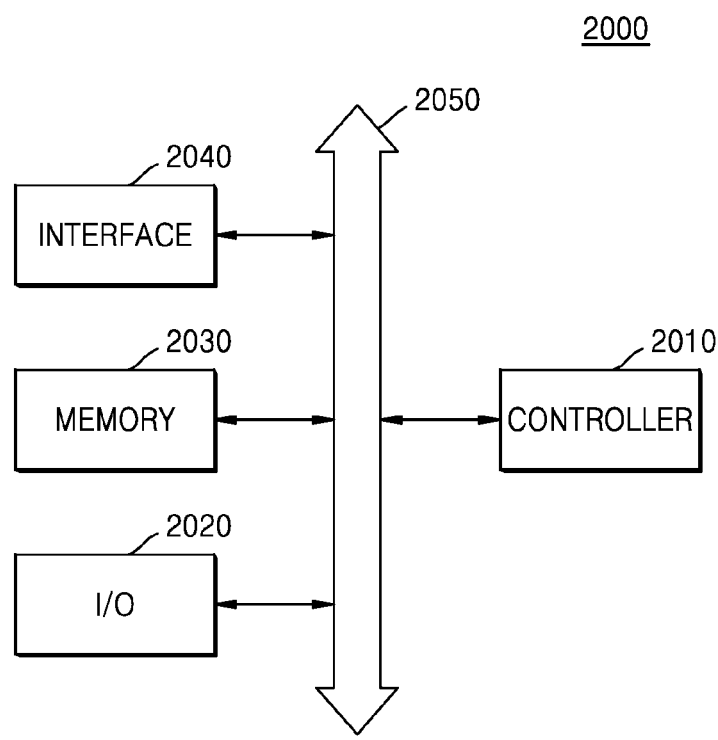

FIG. 15 is a block diagram illustrating an electronic system 2000 according to an example embodiment of the inventive concepts.

The electronic system 2000 may include a controller 2010, an input/output (I/O) device 2020, a memory 2030, and an interface 2040 connected to each other through a bus 2050.

The controller 2010 may include at least one of a microprocessor, a digital signal processor, and a similar processor. The I/O device 2020 may include at least one of a keypad, a keyboard, and a display. The memory 2030 may be used for storing commend executed by the controller 2010. For example, the memory 2030 may be used for storing user data.

The electronic system 2000 may constitute a device capable of transmitting and/or receiving information in a wireless communication device or under a wireless environment. The interface 2040 of the electronic system 2000 may be configured with a wireless interface to transmit and receive data through a wireless communication network. The interface 2040 may include an antenna and/or a wireless transceiver. In an example embodiment, the electronic system 2000 may be used for a communication interface protocol of third generation communication system such as a code division multiple access (CDMA), a global system for mobile communications (GSM), a north American digital cellular (NADC), an extended-time division multiple access (E-TDMA), and a wide band code division multiple access (WCMA). The electronic system 2000 may include at least one of the integrated circuit devices 100, 200, 300, 400, 500, 600, 700, 800, and 900 according to example embodiments of the inventive concepts described with reference to FIGS. 1 through 12 and modified integrated circuit devices within the scope of the inventive concepts from these.

While the inventive concept has been particularly shown and described with reference to example embodiments thereof, it will be understood that various changes in form and details may be made therein without departing from the spirit and scope of the following claims.

What is claimed is:

1. An integrated circuit device comprising:
a substrate including an active region;
an interfacial layer including a lower insulating layer on the active region, the lower insulating layer doped with a chalcogen element having an atomic weight equal to or greater than 16, and an upper insulating layer on the lower insulating layer, wherein the upper insulating layer does not include a chalcogen element having an atomic weight equal to or greater than 16;
a gate insulation layer on the upper insulating layer of the interfacial layer; and
a gate electrode on the gate insulation layer,
wherein the lower insulating layer includes a sulfur-doped aluminum oxide ($Al_2O_3$) layer, a sulfur-doped silicon oxide ($SiO_2$) layer, a sulfur-doped silicon oxynitride (SiON) layer, a sulfur-doped silicon nitride ($Si_3N_4$) layer, or a combination thereof.

2. The device of claim 1, wherein the lower insulating layer is in contact with the active region.

3. The device of claim 1, wherein the substrate includes a V group material, a IV group material, or a combination thereof.

4. The device of claim 1, wherein the chalcogen element includes sulfur.

5. The device of claim 1, wherein the upper insulating layer includes an aluminum oxide ($Al_2O_3$) layer, a silicon oxide ($SiO_2$) layer, a silicon oxynitride (SiON) layer, an aluminum silicon oxide ($AlSiO_x$, x>0) layer, or a combination thereof.

6. The device of claim 1, wherein a content of the chalcogen element in the lower insulating layer is variable along the thickness direction of the lower insulating layer and is greater as close to the substrate.

7. The device of claim 1, wherein the gate insulation layer includes a material whose dielectric constant is greater than a dielectric constant of the interfacial layer.

8. An integrated circuit device comprising:
a substrate including a first region and a second region;
a first transistor including a first interfacial layer on the substrate of the first region, a first gate insulation layer on the first interfacial layer, and a first gate electrode on the first gate insulation layer, wherein the first interfacial layer includes a double layer structure having a sulfur-doped lower insulating layer doped with a chalcogen element having an atomic weight equal to or greater than 16 and an upper insulating layer free of sulfur; and
a second transistor including a second interfacial layer on the substrate of the second region, a passivation layer between the substrate of the second region and the second interfacial layer, a second gate insulation layer on the second interfacial layer, and a second gate electrode on the second gate insulation layer, wherein the second interfacial layer includes a material having a composition different from a composition of a material of the lower insulating layer, wherein the lower insulating layer of the first interfacial layer includes a sulfur-doped aluminum oxide ($Al_2O_3$) layer, a sulfur-doped silicon oxide ($SiO_2$) layer, a sulfur-doped silicon oxynitride (SiON) layer, a sulfur-doped silicon nitride ($Si_3N_4$) layer, or a combination thereof.

9. The device of claim 8,
wherein the second interfacial layer includes a single layer structure having a material identical to the upper insulating layer.

10. The device of claim 8, wherein the first interfacial layer has a first thickness and the second interfacial layer has a second thickness less than the first thickness.

11. The device of claim 8,
wherein the second interfacial layer contacts the passivation layer.

12. The device of claim 8, wherein the first gate insulation layer includes a same material as the second gate insulation layer.

13. The device of claim 8, wherein each of the first region and the second region of the substrate includes a III-V group material or a IV group material.

14. The device of claim 8, wherein each of the first region and the second region of the substrate includes InP, $In_zGa_{1-z}As$ ($0 \leq z \leq 1$), $Al_zGa_{1-z}As$ ($0 \leq z \leq 1$), or Ge.

15. The device of claim 8, wherein at least one of the first and second regions includes a first conductivity type transistor region and a second conductivity type transistor region being different from each other,
wherein the first conductivity type transistor region includes a III-V group material-based active region and the second conductivity type transistor region includes a germanium-based active region.

16. The device of claim 11,
wherein the passivation layer includes at least one sulfur atomic layer.

17. The device of claim 16, wherein the second interfacial layer contacts the at least one sulfur atomic layer.

18. An integrated circuit device comprising:
a substrate including a first region and a second region;
a first fin-shaped active region protruding from the substrate of the first region and a second fin-shaped active region protruding from the substrate of the second region;
a first transistor including a first interfacial layer on the substrate of the first region, a first gate insulation layer on the first interfacial layer and a first gate electrode on the first gate insulation layer, wherein the first interfacial layer includes a lower insulating layer doped with a chalcogen element having an atomic weight equal to or greater than 16; and
a second transistor including a second interfacial layer on the substrate of the second region, a sulfur passivation layer interposed between the substrate of the second region and the second interfacial layer, a second gate insulation layer on the second interfacial layer and a second gate electrode on the second gate insulation layer, wherein the second interfacial layer includes a material having a composition different from a composition of a material of the lower insulating layer,
wherein the first interfacial layer, the first gate insulation layer, and the first gate electrode cover a top surface and opposite sidewalls of the first fin-shaped active region and extend in a direction crossing the first fin-shaped active region,
wherein the second interfacial layer, the second gate insulation layer, and the second gate electrode cover a top surface and opposite sidewalls of the second fin-shaped active region and extend in a direction crossing the second fin-shaped active region, and
wherein the lower insulating layer of the first interfacial layer includes a sulfur-doped aluminum oxide ($Al_2O_3$) layer, a sulfur-doped silicon oxide ($SiO_2$) layer, a sulfur-doped silicon oxynitride (SiON) layer, a sulfur-doped silicon nitride ($Si_3N_4$) layer, or a combination thereof.

19. The device of claim 18, wherein the sulfur passivation layer consists essentially of S atoms.

* * * * *